United States Patent
Kim et al.

(10) Patent No.: US 8,432,762 B2
(45) Date of Patent: Apr. 30, 2013

(54) BITLINE SENSE AMPLIFIER, MEMORY CORE INCLUDING THE SAME AND METHOD OF SENSING CHARGE FROM A MEMORY CELL

(75) Inventors: Joung-Yeal Kim, Yongin-si (KR); Seong-Jin Jang, Seongnam-si (KR); Jin-Seok Kwak, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 189 days.

(21) Appl. No.: 13/006,832

(22) Filed: Jan. 14, 2011

(65) Prior Publication Data
US 2011/0205822 A1    Aug. 25, 2011

(30) Foreign Application Priority Data

Feb. 23, 2010   (KR) .............................. 2010-0015943

(51) Int. Cl.
*G11C 7/02*       (2006.01)
(52) U.S. Cl.
USPC .. 365/207; 365/196; 365/189.09; 365/210.12; 365/230.06

(58) Field of Classification Search .................. 365/207, 365/196, 189.02, 210.12, 230.06
See application file for complete search history.

(56) References Cited

U.S. PATENT DOCUMENTS

| | | | | |
|---|---|---|---|---|
| 6,104,655 A | * | 8/2000 | Tanoi et al. | ............... 365/205 |
| 7,609,572 B2 | | 10/2009 | Nakaya et al. | |
| 2010/0128545 A1 | * | 5/2010 | Lee et al. | ................... 365/205 |

FOREIGN PATENT DOCUMENTS

| | | |
|---|---|---|
| JP | 6309872 | 4/1994 |
| JP | 2008186547 | 8/2008 |
| KR | 1020020041116 A | 1/2002 |

* cited by examiner

*Primary Examiner* — Thong Q Le
(74) *Attorney, Agent, or Firm* — Volentine & Whitt, PLLC

(57) ABSTRACT

A bitline sense amplifier includes a pre-sensing unit and an amplification unit. The pre-sensing unit is connected to a first bitline and a second bitline, and is configured to perform a pre-sensing operation by controlling a voltage level of the second bitline based on at least one pre-sensing voltage and variation of a voltage level of the first bitline. The amplification unit is configured to perform a main amplification operation by amplifying a pre-sensed voltage difference based on a first voltage signal and a second voltage signal. The pre-sensed voltage difference indicates a difference between the voltage level of the first bitline and the voltage level of the second bitline after the pre-sensing operation.

19 Claims, 17 Drawing Sheets

BITLINE SENSE AMPLIFIER, MEMORY CORE INCLUDING THE SAME AND METHOD OF SENSING CHARGE FROM A MEMORY CELL

CROSS-REFERENCE TO RELATED APPLICATION

A claim of priority under 35 U.S.C. §119 is made to Korean Patent Application No. 2010-0015943, filed on Feb. 23, 2010, the entire contents of which are hereby incorporated by reference.

BACKGROUND

Illustrative embodiments relate to a charge sensing technique, and more particularly to a bitline sense amplifier included in a semiconductor memory device, a memory core including the bitline sense amplifier and a method of sensing charge from a memory cell connected to a bitline.

A semiconductor memory device stores data into a memory cell by performing a write operation, and reads the stored data by performing a read operation. The read operation generally includes a precharge operation followed by a sensing operation. In the precharge operation, a bitline pair is precharged to a predetermined voltage level. After the bitline pair has been precharged, a charge sharing operation is performed, such that charges stored in the memory cell are shared with the bitline pair. A difference between voltage levels of the bitlines in the bitline pair is caused due to the charge sharing operation. In the sensing operation, the voltage difference is sensed and amplified to determine the data stored in the memory cell. For example, the voltage levels of the bitline pair are developed (e.g., decreased or increased) according to the stored data, and then the developed voltage levels of the bitline pair are sensed to determine the data stored in the memory cell. The semiconductor memory device generally includes multiple bitline sense amplifiers that sense and amplify the voltage differences.

SUMMARY

Various illustrative embodiments of the inventive concept provide a bitline sense amplifier configured to effectively sense charge from a memory cell connected to a bitline. Various illustrative embodiments provide a memory core including the bitline sense amplifier. Also, various illustrative embodiments provide a method of sensing charge from a memory cell connected to a bitline.

According to illustrative embodiments, a bitline sense amplifier includes a pre-sensing unit and an amplification unit. The pre-sensing unit is connected to a first bitline and a second bitline and performs a pre-sensing operation by controlling a voltage level of the second bitline based on at least one pre-sensing voltage and variation of a voltage level of the first bitline. The amplification unit performs a main amplification operation by amplifying a pre-sensed voltage difference based on a first voltage signal and a second voltage signal. The pre-sensed voltage difference indicates a difference between the voltage level of the first bitline and the voltage level of the second bitline after the pre-sensing operation.

The pre-sensing unit may sense the variation of the voltage level of the first bitline and may apply the at least one pre-sensing voltage to the second bitline in response to a varied voltage level of the first bitline and the voltage level of the second bitline to control the voltage level of the second bitline.

The pre-sensing unit may apply the at least one pre-sensing voltage to the second bitline when the varied voltage level of the first bitline is higher than the voltage level of the second bitline. The pre-sensing unit may maintain the voltage level of the second bitline when the varied voltage level of the first bitline is lower than the voltage level of the second bitline.

The pre-sensing unit may apply a first pre-sensing voltage of the at least one pre-sensing voltage to the second bitline when the varied voltage level of the first bitline is higher than the voltage level of the second bitline. The pre-sensing unit may apply a second pre-sensing voltage of the at least one pre-sensing voltage to the second bitline when the varied voltage level of the first bitline is lower than the voltage level of the second bitline.

The pre-sensing unit may include a pre-sensing voltage providing unit and a switching unit. The pre-sensing voltage providing unit may provide the at least one pre-sensing voltage in response to at least one enable signal. The switching unit may apply the at least one pre-sensing voltage to the second bitline in response to a varied voltage level of the first bitline and the voltage level of the second bitline.

The switching unit may electrically connect the pre-sensing voltage providing unit with the second bitline when data stored in a memory cell has a first logic level, where the memory cell is connected to the first bitline. The switching unit may electrically disconnect the pre-sensing voltage providing unit from the second bitline when the data has a second logic level.

The amplification unit may include multiple transistors operating selectively as the amplification unit and the switching unit. The transistors may operate as the switching unit when the at least one pre-sensing voltage is applied to the transistors. The transistors may operate as the amplification unit when one of the first voltage signal and second voltage signal is applied to the transistors.

The pre-sensing unit may include a first pre-sensing voltage providing unit, a second pre-sensing voltage providing unit, a first switching unit and a second switching unit. The first pre-sensing voltage providing unit may provide a first pre-sensing voltage of the at least one pre-sensing voltage in response to a first enable signal. The second pre-sensing voltage providing unit may provide a second pre-sensing voltage of the at least one pre-sensing voltage in response to a second enable signal. The first switching unit may apply the first pre-sensing voltage to the second bitline in response to a varied voltage level of the first bitline and the voltage level of the second bitline. The second switching unit may apply the second pre-sensing voltage to the second bitline in response to the varied voltage level of the first bitline and the voltage level of the second bitline.

The first switching unit may electrically connect the first pre-sensing voltage providing unit with the second bitline when data stored in a memory cell has a first logic level, where the memory cell is connected to the first bitline. The second switching unit may electrically connect the second pre-sensing voltage providing unit with the second bitline when the data has a second logic level.

The pre-sensing unit may further perform a second pre-sensing operation by controlling the voltage level of the first bitline based on the at least one pre-sensing voltage and variation of the voltage level of the second bitline.

The pre-sensing unit may include a first pre-sensing voltage providing unit, a second pre-sensing voltage providing unit, a first switching unit and a second switching unit. The first pre-sensing voltage providing unit may provide the at least one pre-sensing voltage in response to a first enable signal. The second pre-sensing voltage providing unit may provide the at least one pre-sensing voltage in response to a second enable signal. The first switching unit may apply the at least one pre-sensing voltage to the second bitline in response to a varied voltage level of the first bitline and the voltage level of the second bitline. The second switching unit may apply the at least one pre-sensing voltage to the first bitline in response to the voltage level of the first bitline and a varied voltage level of the second bitline.

The at least one pre-sensing voltage may be generated based on a precharge voltage and threshold voltages of transistors included in the bitline sense amplifier.

According to various illustrative embodiments, a memory core includes multiple memory cells, a bitline sense amplifier and a column selection circuit. The memory cells are connected to one of a first bitline and a second bitline. The bitline sense amplifier performs a pre-sensing operation based on at least one pre-sensing voltage and variation of a voltage level of the first bitline and performs a main amplification operation by amplifying a pre-sensed voltage difference based on a first voltage signal and a second voltage signal. The pre-sensed voltage difference indicates a difference between the voltage level of the first bitline and a voltage level of the second bitline after the pre-sensing operation. The column selection circuit electrically connects the first bitline with a first local input/output (I/O) line and electrically connects the second bitline with a second local I/O line based on a column selection signal.

The bitline sense amplifier may include a pre-sensing unit and an amplification unit. The pre-sensing unit may perform the pre-sensing operation by controlling the voltage level of the second bitline based on the at least one pre-sensing voltage and the variation of the voltage level of the first bitline. The amplification unit may perform the main amplification operation by amplifying the pre-sensed voltage difference based on the first voltage signal and the second voltage signal.

According to various illustrative embodiments, a method of sensing charge from a memory cell connected to one of first and second bitlines in a semiconductor memory device is provided. The method includes performing a pre-sensing operation by controlling a voltage level of the second bitline based on at least one pre-sensing voltage and variation of a voltage level of the first bitline, and performing a main amplification operation by amplifying a pre-sensed voltage difference based on a first voltage signal and a second voltage signal. The pre-sensed voltage difference indicates a difference between the voltage level of the first bitline and the voltage level of the second bitline after the pre-sensing operation.

When the pre-sensing operation is performed, the variation of the voltage level of the first bitline may be sensed. The at least one pre-sensing voltage may be applied to the second bitline based on a varied voltage level of the first bitline and the voltage level of the second bitline.

When the at least one pre-sensing voltage is applied to the second bitline, the at least one pre-sensing voltage may be applied to the second bitline when if the varied voltage level of the first bitline is higher than the voltage level of the second bitline. The voltage level of the second bitline may be maintained if the varied voltage level of the first bitline is lower than the voltage level of the second bitline.

When the at least one pre-sensing voltage is applied to the second bitline, a first pre-sensing voltage of the at least one pre-sensing voltage may be applied to the second bitline if the varied voltage level of the first bitline is higher than the voltage level of the second bitline. A second pre-sensing voltage of the at least one pre-sensing voltage may be applied to the second bitline if the varied voltage level of the first bitline is lower than the voltage level of the second bitline.

The at least one pre-sensing voltage may be provided based on at least one enable signal.

Accordingly, in the bitline sense amplifier according to various illustrative embodiments, the pre-sensing unit performs the pre-sensing operation based on at least one pre-sensing voltage and variation of the voltage level of the first bitline, and the amplification unit performs a main amplification operation by amplifying a pre-sensed voltage difference. In addition, the bitline sense amplifier according to various illustrative embodiments is implemented with the same type of transistors having the same threshold voltage. Thus, the sensing margin may be enhanced and the bitline sense amplifier may effectively sense a difference between voltage levels of the first and second bitlines to determine the data stored in the memory cell with a relatively simple structure. Also, the bitline sense amplifier may be manufactured using relatively simple processes and relatively low costs.

BRIEF DESCRIPTION OF THE DRAWINGS

The embodiments of the inventive concept will be described with reference to the attached drawings.

DETAILED DESCRIPTION

Figure 1:
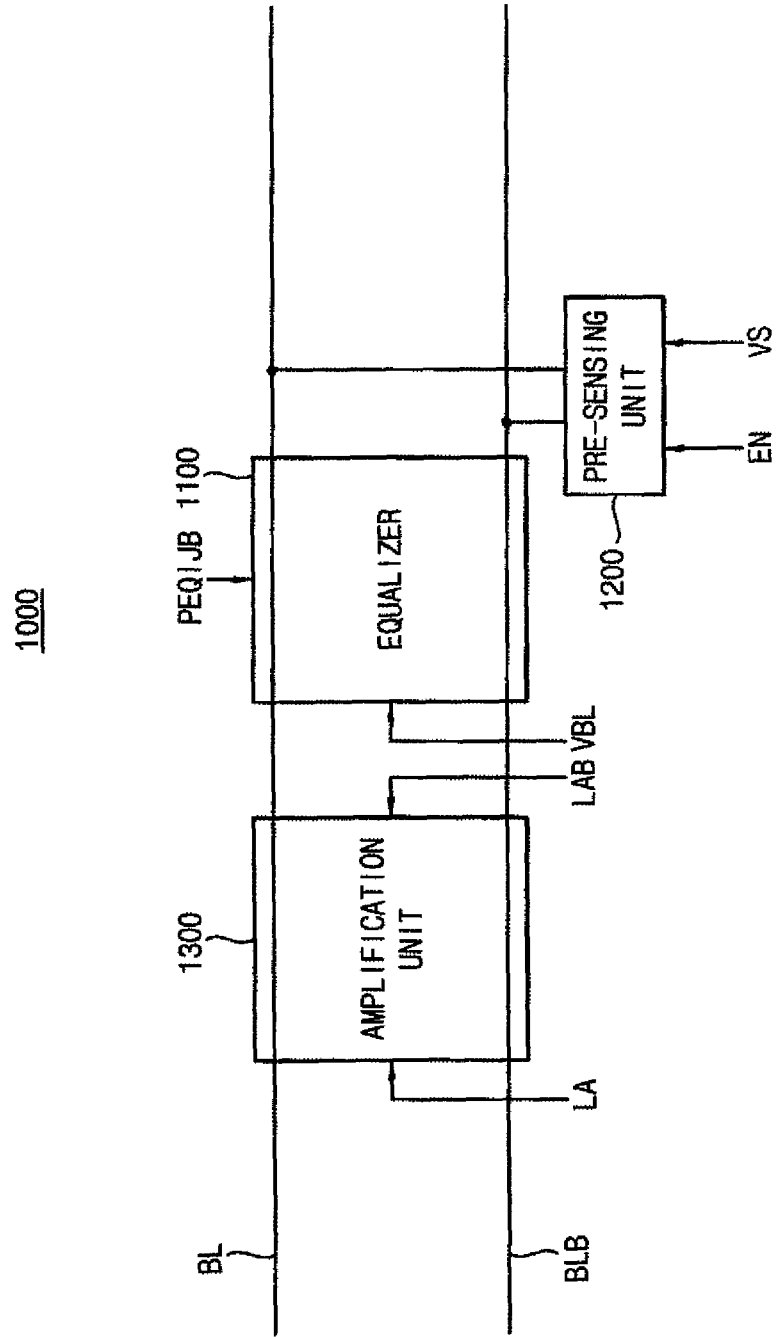
FIG. 1 is a block diagram illustrating a bitline sense amplifier, according to illustrative embodiments.

The inventive concept will now be described more fully with reference to the accompanying drawings, in which exemplary embodiments of the inventive concept are shown. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. In the drawings, the thicknesses of layers and regions are exaggerated for clarity. Unless otherwise noted, like reference numerals denote like elements throughout the attached drawings and written description, and thus descriptions will not be repeated.

It will be understood that, although the terms first, second, third, etc., may be used to describe various elements, these elements are not be limited by these terms. Rather, these terms are used to distinguish one element from another. Thus, a first element could be termed a second element without departing from the scope of the present teachings. Also, as used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular illustrative embodiments only, and is not intended to be limiting of the present inventive concept. The singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not necessarily preclude the presence or addition of one or more other features, integers, steps, operations, elements, components, and/or groups thereof.

Unless otherwise defined, all terms (including technical and scientific terms) have the same meaning as commonly understood by one of ordinary skill in the art to which the inventive concept belongs. It will be further understood that terms should be interpreted as having meanings consistent with their meanings in the context of the relevant art, and should not be interpreted in an idealized or overly formal sense unless expressly so defined herein.

FIG. 1 is a block diagram illustrating a bitline sense amplifier, according to illustrative embodiments.

Referring to FIG. 1, bitline sense amplifier 1000 includes an equalizer 1100, a pre-sensing unit 1200 and an amplification unit 1300. The bitline sense amplifier 1000 may further include an amplification control unit (not illustrated) that controls the amplification unit 1300.

The bitline sense amplifier 1000 is connected between a first bitline BL and a second bitline BLB that form a bitline pair. The first bitline BL may be referred to as a bitline and the second bitline BLB may be referred to as a complementary bitline. A memory cell (not illustrated) may be connected to one or both of the first and second bitlines BL and BLB, according to various embodiments.

The equalizer 1100 is connected between the first bitline BL and the second bitline BLB. The equalizer 1100 precharges the first and second bitlines BL and BLB to a level of a precharge voltage VBL based on an equalization control signal PEQIJB. For example, when the equalization control signal PEQIJB is enabled (i.e., activated), the equalizer 1100 may start to precharge the first and second bitlines BL and BLB to the level of the precharge voltage VBL. When the first and second bitlines BL and BLB are fully precharged, the equalization control signal PEQIJB may be disabled (i.e., deactivated).

After the precharge operation, when a wordline connected to the memory cell is activated based on a wordline enable signal to select the memory cell, charges stored in the memory cell and in a corresponding bitline are shared, and a voltage level of the corresponding bitline is varied due to the charge sharing operation. For example, when the memory cell is connected to the first bitline BL, a voltage level of the first bitline BL may be varied based on a logic level of data stored in the memory cell. When the memory cell is connected to the second bitline BLB, a voltage level of the second bitline BLB may be varied based on the logic level of the data. Thus, a difference between the voltage level of the first bitline BL and the voltage level of the second bitline BLB is caused due to the charge sharing operation.

Hereinafter, the difference between the voltage level of the first bitline BL and the voltage level of the second bitline BLB due to the charge sharing operation may be referred to as an input voltage difference. The input voltage difference may be calculated by subtracting the voltage level of the second bitline BLB from the voltage level of the first bitline BL. Examples of bitline sense amplifiers in which the memory cell is connected to the first bitline BL will be described with reference to FIGS. 2 through 10, and other examples of bitline sense amplifiers in which the memory cell is connected to both of the first bitline BL and the second bitline BLB will be described with reference to FIGS. 11 through 15.

The pre-sensing unit 1200 is connected to the first bitline BL and the second bitline BLB. The pre-sensing unit 1200 performs a pre-sensing operation after the charge-sharing operation is performed. The pre-sensing unit 1200 performs the pre-sensing operation by controlling the voltage level of the second bitline BLB based on at least one pre-sensing voltage VS and variation of the voltage level of the first bitline BL. As described above, the voltage level of the first bitline BL may be varied due to the charge sharing operation.

In an illustrative embodiment, the pre-sensing unit 1200 senses the variation of the voltage level of the first bitline BL and applies the at least one pre-sensing voltage VS to the second bitline BLB in response to a varied voltage level of the first bitline BL and the voltage level of the second bitline BLB to control the voltage level of the second bitline BLB. For example, the pre-sensing unit 1200 may compare the varied voltage level of the first bitline BL and the voltage level of the second bitline BLB to control the voltage level of the second bitline BLB. The at least one pre-sensing voltage VS may be provided based on at least one enable signal EN. The at least one pre-sensing voltage VS may have a predetermined voltage level. For example, the predetermined voltage level may be higher than the level of the precharge voltage VBL or lower than the level of the precharge voltage VBL.

The amplification unit 1300 is connected between the first bitline BL and the second bitline BLB. The amplification unit 1300 performs a main amplification operation after the pre-sensing operation is performed. The amplification unit 1300 performs the main amplification operation by amplifying a pre-sensed voltage difference based on a first voltage signal LA and a second voltage signal LAB. The pre-sensed voltage difference indicates a difference between the voltage level of the first bitline and the voltage level of the second bitline after the pre-sensing operation. The pre-sensed voltage difference may be calculated by subtracting the voltage level of the second bitline BLB from the voltage level of the first bitline BL.

In an illustrative embodiment, the first voltage signal LA may have a level of a power supply voltage or a level of an internal voltage generated based on the power supply voltage during the main amplification operation. The second voltage signal LAB may have a level of a ground voltage during the main amplification operation. The first voltage signal LA may be provided through a first power supply line and the second voltage signal LAB may be provided through a second power supply line.

Hereinafter, reference numeral LA indicates the first voltage signal and/or the first power supply line and reference numeral LAB indicates the second voltage signal and/or the second power supply line.

In an illustrative embodiment, the voltage levels of the first and second bitlines BL and BLB may be determined based on the logic level of the data stored in the memory cell. The voltage levels of the first and second bitlines BL and BLB will be described below with reference to FIGS. 4, 5, 8 and 9.

A conventional bitline sense amplifier is implemented with different types of transistors that have different threshold voltages in order to enhance sensing margin. For example, the conventional bitline sense amplifier may include first transistors having a first threshold voltage and second transistors having a second threshold voltage. The conventional bitline sense amplifier may primarily amplify a difference between a voltage level of a first bitline and a voltage level of a second bitline due to a charge sharing operation (i.e., input voltage difference) by using the first transistors, and may secondarily amplify the primarily-amplified voltage difference by using the second transistors in order to effectively sense and amplify the input voltage difference to determine data stored in a memory cell. However, the conventional bitline sense amplifier is manufactured with relatively complex processes and relatively high costs. In addition, the conventional bitline sense amplifier has relatively complex structure.

In the bitline sense amplifier 1000, according to illustrative embodiments, the pre-sensing unit 1200 performs the pre-sensing operation by controlling the voltage level of the second bitline BLB based on the at least one pre-sensing voltage VS and the variation of the voltage level of the first bitline BL. The amplification unit 1300 performs the main amplification operation by amplifying the pre-sensed voltage difference. In addition, the bitline sense amplifier 1000, according to illustrative embodiments, may be implemented with the same type of transistors, and the transistors included in the pre-sensing unit 1200 may have a threshold voltage that is substantially the same as a threshold voltage of transistors included in the amplification unit 1300. Thus, the bitline sense amplifier 1000 enhances the sensing margin, and effectively senses and amplifies the input voltage difference to determine the data stored in the memory cell with a relatively simple structure. Further, the bitline sense amplifier 1000 may be manufactured with relatively simple processes and relatively low costs, e.g., as compared with conventional bitline sense amplifiers.

Figure 2:
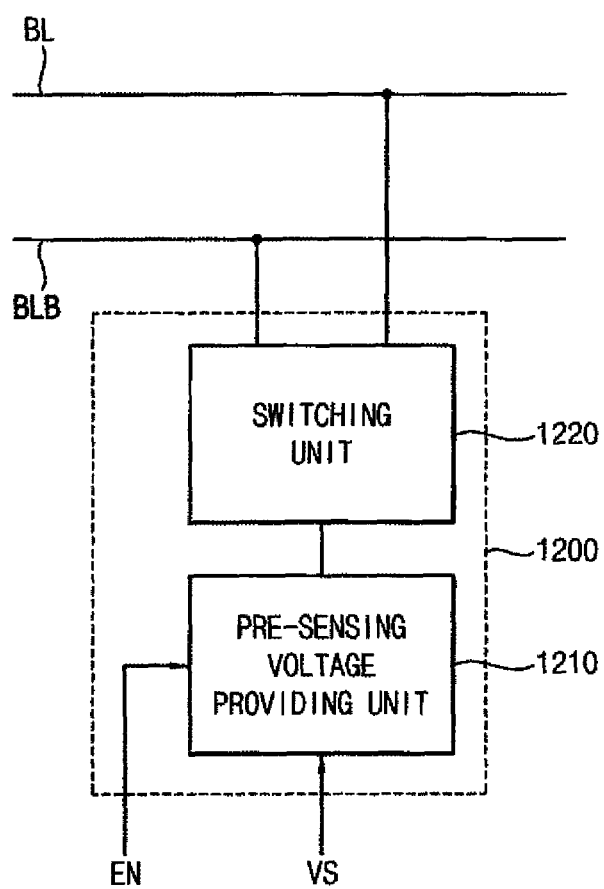
FIG. 2 is a block diagram illustrating a pre-sensing unit included in the bitline sense amplifier of FIG. 1, according to an illustrative embodiment.

FIG. 2 is a block diagram illustrating an example of a pre-sensing unit included in the bitline sense amplifier of FIG. 1, according to an illustrative embodiment.

Referring to FIG. 2, the pre-sensing unit 1200 includes a pre-sensing voltage providing unit 1210 and a switching unit 1220.

The pre-sensing voltage providing unit 1210 provides the at least one pre-sensing voltage VS in response to the at least one enable signal EN. For example, when the at least one enable signal EN is activated, the pre-sensing voltage providing unit 1210 may provide the at least one pre-sensing voltage VS to the switching unit 1220. The at least one enable signal EN may be generated from a control circuit (not illustrated) that is included in a semiconductor memory device having the bitline sense amplifier 1000 of FIG. 1. The at least one pre-sensing voltage VS may be generated from a voltage generator (not illustrated) that is included in the semiconductor memory device.

The switching unit 1220 applies the at least one pre-sensing voltage VS to the second bitline BLB in response to the varied voltage level of the first bitline BL and the voltage level of the second bitline BLB. In an illustrative embodiment, the voltage levels of the first and second bitlines BL and BLB may be determined based on the logic level of the data stored in the memory cell.

The pre-sensing voltage providing unit 1210 and the switching unit 1220 may include at least one transistor, respectively. In an illustrative embodiment, the transistors included in the pre-sensing voltage providing unit 1210 and the switching unit 1220 are substantially the same as transistors included in the equalizer 1100 and the amplification unit 1300 in FIG. 1. For example, the transistors included in the pre-sensing voltage providing unit 1210 and the switching unit 1220 may have a threshold voltage that is substantially the same as a threshold voltage of the transistors included in the equalizer 1100 and the amplification unit 1300 in FIG. 1.

In an illustrative embodiment, the at least one pre-sensing voltage VS may be generated based on the precharge voltage VBL and the threshold voltage of the transistors included in the pre-sensing unit 1200. For example, the at least one pre-sensing voltage VS may be calculated by adding the threshold voltage to the precharge voltage VBL or by subtracting the threshold voltage from the precharge voltage VBL.

Figure 3:
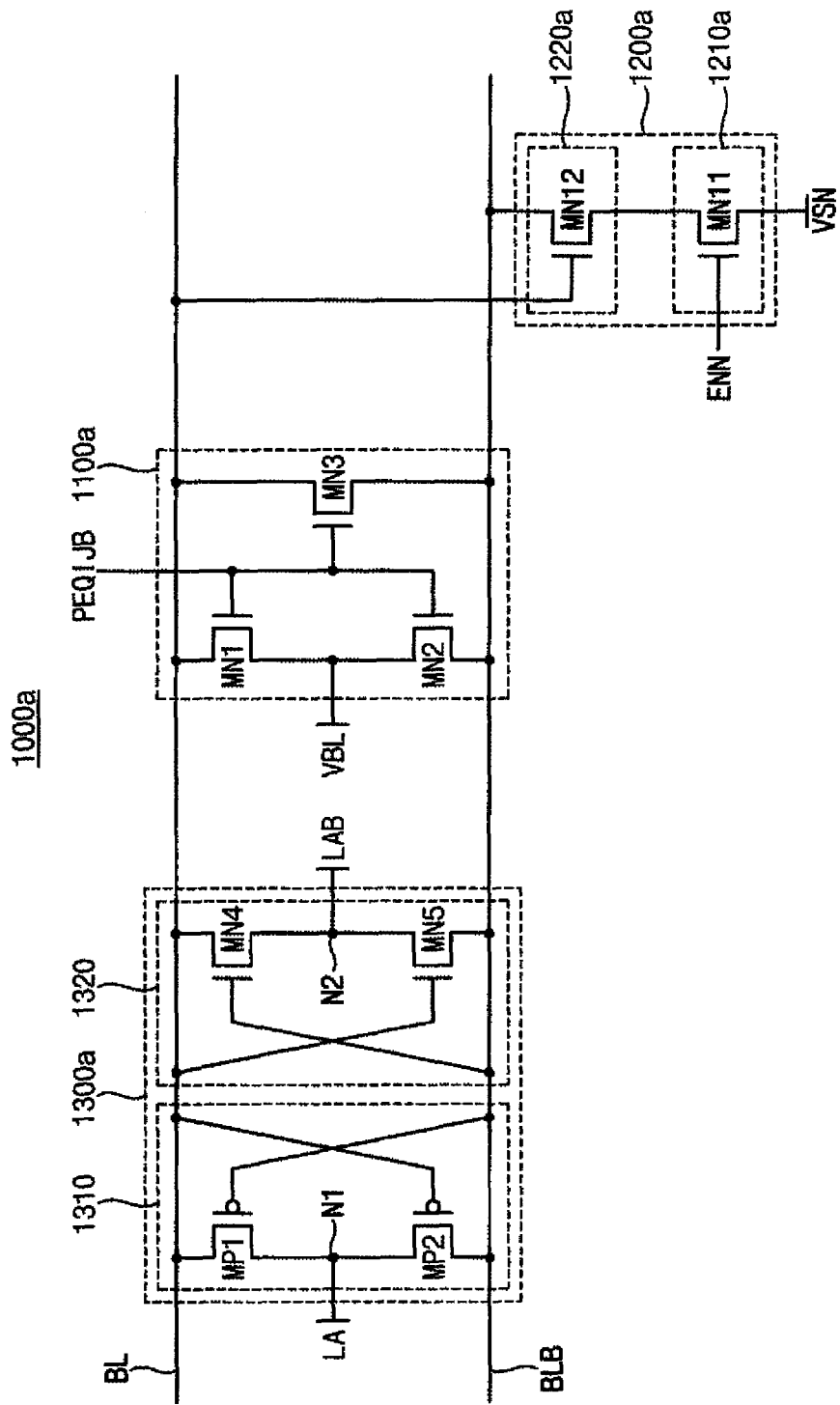
FIG. 3 is a circuit diagram illustrating an example of the bitline sense amplifier of FIG. 1, according to an illustrative embodiment.

FIG. 3 is a circuit diagram illustrating an example of the bitline sense amplifier of FIG. 1, according to an illustrative embodiment. In bitline sense amplifier 1000*a* of FIG. 3, for example, the first bitline BL is connected to the memory cell and the second bitline BLB is not connected to the memory cell and operates as a reference bitline.

Referring to FIG. 3, the bitline sense amplifier 1000*a* includes an equalizer 1100*a*, a pre-sensing unit 1200*a* and an amplification unit 1300*a*.

As described above, the equalizer 1100*a* precharges the first and second bitlines BL and BLB to the precharge voltage VBL based on the equalization control signal PEQIJB. The equalizer 1100*a* includes a first NMOS transistor MN1, a second NMOS transistor MN2 and a third NMOS transistor MN3. The first and second NMOS transistors MN1 and MN2 are connected between the first bitline BL and the second bitline BLB in serial. The third NMOS transistor MN3 is connected between the first bitline BL and the second bitline BLB. Each of gates of the NMOS transistors MN1, MN2 and MN3 is connected to the equalization control signal PEQIJB.

As described above, the amplification unit 1300a performs the main amplification operation by amplifying the pre-sensed voltage difference based on the first voltage signal LA and the second voltage signal LAB. The amplification unit 1300a includes a p-type amplification unit 1310 and an n-type amplification unit 1320.

The p-type amplification unit 1310 amplifies the pre-sensed voltage difference based on the first voltage signal LA applied to a first node N1. The n-type amplification unit 1320 amplifies the pre-sensed voltage difference based on the second voltage signal LAB applied to a second node N2. The p-type amplification unit 1310 includes a first PMOS transistor MP1 and a second PMOS transistor MP2. The first and second PMOS transistors MP1 and MP2 are connected between the first bitline BL and the second bitline BLB in serial. The n-type amplification unit 1320 includes a fourth NMOS transistor MN4 and a fifth NMOS transistor MN5. The fourth and fifth NMOS transistors MN4 and MN5 are connected between the first bitline BL and the second bitline BLB in serial. Each of gates of the transistors MP1 and MN4 is connected to the second bitline BLB. Each of gates of the transistors MP2 and MN5 is connected to the first bitline BL.

The pre-sensing unit 1200a performs the pre-sensing operation by controlling the voltage level of the second bitline BLB based on a pre-sensing voltage VSN and the variation of the voltage level of the first bitline BL due to the charge sharing operation.

In an illustrative embodiment, when the varied voltage level of the first bitline BL is higher than the voltage level of the second bitline BLB during the pre-sensing operation, the pre-sensing unit 1200a applies the pre-sensing voltage VSN to the second bitline BLB. Thus, the pre-sensed voltage difference is greater than the input voltage difference. When the varied voltage level of the first bitline BL is lower than the voltage level of the second bitline BLB during the pre-sensing operation, the pre-sensing unit 1200 maintains the voltage level of the second bitline BLB.

The pre-sensing unit 1200a includes a pre-sensing voltage providing unit 1210a and a switching unit 1220a. The pre-sensing voltage providing unit 1210a provides the pre-sensing voltage VSN to the switching unit 1220a based on an enable signal ENN. The pre-sensing voltage providing unit 1210a includes a sixth NMOS transistor MN11. The sixth NMOS transistor MN11 has a first electrode connected to the pre-sensing voltage VSN, a gate connected to the enable signal ENN and a second electrode connected to the switching unit 1220a.

The switching unit 1220a selectively applies the pre-sensing voltage VSN to the second bitline BLB based on the varied voltage level of the first bitline BL and the voltage level of the second bitline BLB. The switching unit 1220a includes a seventh NMOS transistor MN12. The seventh NMOS transistor MN12 has a first electrode connected to the second electrode of the sixth NMOS transistor MN11, a gate connected to the first bitline BL and a second electrode connected to the second bitline BLB.

In an illustrative embodiment, the NMOS transistors MN1 through MN5, MN11 and MN12 included in the bitline sense amplifier 1000a may have substantially the same threshold voltage. The pre-sensing voltage VSN may be generated based on the precharge voltage VBL and the threshold voltage, and may have a level between a level of the precharge voltage VBL and the level of the ground voltage. For example, the pre-sensing voltage VSN may be represented by Equation 1.

$$VSN = VBL - (Vthn - a)$$ [Equation 1]

In the Equation 1, Vthn represents the threshold voltage of the NMOS transistors included in the bitline sense amplifier 1000a and a represents a margin of the threshold voltage Vthn. A level of the threshold voltage Vthn is lower than the input voltage difference in order to turn on the seventh NMOS transistor MN12. For example, the threshold voltage Vthn may have the level of about 0.3V, the margin a may have a voltage level of about 0.05V to about 0.15V (e.g., about a half of the level of the threshold voltage Vthn), and thus the Vthn-a may have a voltage level of about 0.15V to about 0.25V.

In an illustrative embodiment, the pre-sensing unit 1200a may electrically connect or disconnect the pre-sensing voltage providing unit 1210a with the second bitline BLB based on the logic level of the data stored in the memory cell connected to the first bitline BL. For example, the switching unit 1220a may electrically connect the pre-sensing voltage providing unit 1210a with the second bitline BLB when the data has a first logic level. The switching unit 1220a may electrically disconnect the pre-sensing voltage providing unit 1210a from the second bitline BLB when the data has a second logic level. The first logic level may be a logic high level ("1") and the second logic level may be a logic low level ("0"), for example. The seventh NMOS transistor MN12 included in the switching unit 1220a is selectively turned on in response to the logic level of the data.

In an illustrative embodiment, when the semiconductor memory device includes multiple bitline sense amplifiers, according to various illustrative embodiments, each of the bitline sense amplifiers may share a single pre-sensing voltage providing unit. For example, the switching units may be disposed in a sense amplifier region of the semiconductor memory device, such that each of the bitline sense amplifiers may include a corresponding switching unit. The single pre-sensing voltage providing unit may be disposed in a conjunction region of the semiconductor memory device, such that each of the bitline sense amplifiers may receive the pre-sensing voltage VSN from the single pre-sensing voltage providing unit based on the enable signal ENN. In this case, the semiconductor memory device may be implemented with relatively the small number of transistors, and thus increasing the degree of integration of the semiconductor memory device.

Figure 4:
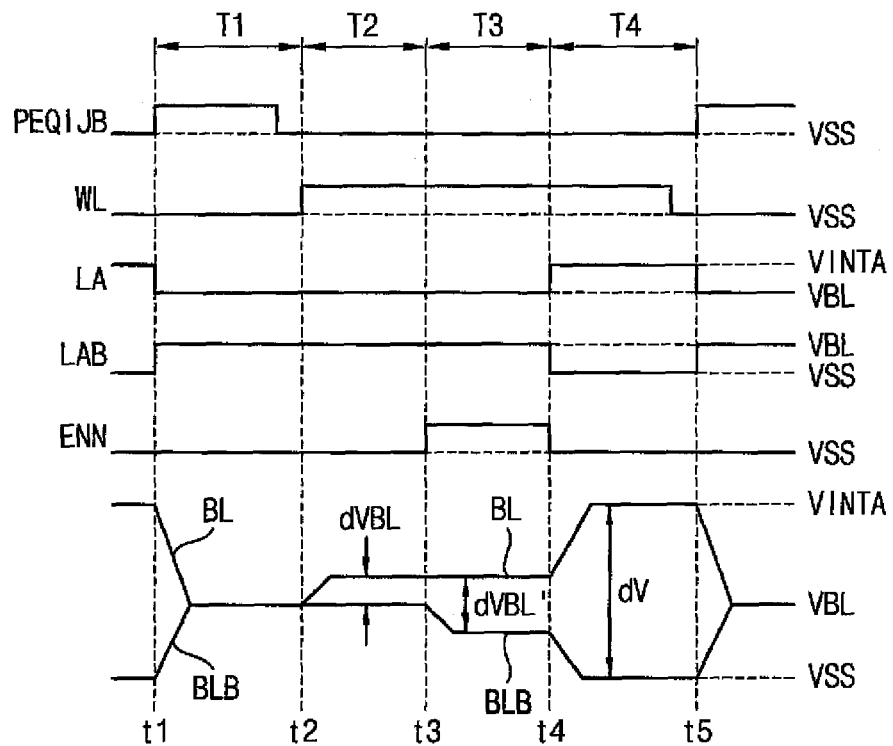
FIGS. 4 and 5 are timing diagrams illustrating operations of the bitline sense amplifier of FIG. 3, according to an illustrative embodiment.
Figure 5:
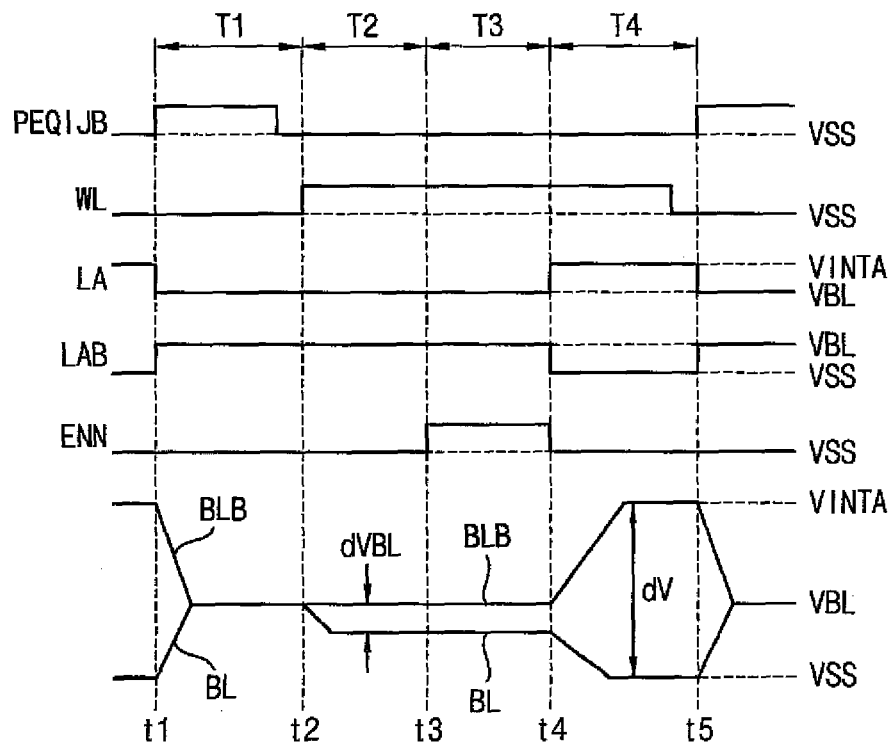

FIGS. 4 and 5 are timing diagrams illustrating operations of the bitline sense amplifier of FIG. 3, according to illustrative embodiments.

FIG. 4 illustrates an operation of the bitline sense amplifier 1000a of FIG. 3 when the data stored in the memory cell connected to the first bitline BL has the first logic level. FIG. 5 illustrates an operation of the bitline sense amplifier 1000a of FIG. 3 when the data has the second logic level.

In FIGS. 4 and 5, time period T1 indicates a precharge period, time period T2 indicates a charge sharing period, time period T3 indicates a pre-sensing period and time period T4 indicates a main amplification period. The time period T1 includes a precharge region, an equalization region and a floating region. The bitline sense amplifier 1000a of FIG. 3 performs the precharge operation during the time period T1, the charge sharing operation during the time period T2, the pre-sensing operation during the time period T3 and the main amplification operation during the time period T4. The bitline sense amplifier 1000a of FIG. 3 may repeat such precharge, charge sharing, pre-sensing and main amplification operations depending on the data reading operation.

Referring to FIGS. 3 and 4, at time t1, the equalization control signal PEQIJB is activated. During the time period T1, the first and second bitlines BL and BLB are precharged to the level of the precharge voltage VBL. The voltage levels of the first and second bitlines BL and BLB maintain the level of the precharge voltage VBL. The equalization control signal PEQIJB is deactivated before a word line enable signal WL applied to the memory cell is activated, and thus the first and second bitlines BL and BLB await the charge sharing operation.

At time t2, the word line enable signal WL is activated. During the time period T2, charges stored in the memory cell and in the first bitline BL connected to the memory cell are shared. In FIG. 4, the voltage level of the first bitline BL increases by an input voltage difference dVBL because the data stored in the memory cell has the first logic level (e.g., logic high level). The voltage level of the second bitline BLB maintains the level of the precharge voltage VBL. The voltage level of the first bitline BL is higher than the voltage level of the second bitline BLB and thus the seventh NMOS transistor MN12 in FIG. 3 is turned on due to the variation of the voltage level of the first bitline BL.

At time t3, the enable signal ENN is activated. During the time period T3, the sixth NMOS transistor MN11 is turned on and the pre-sensing voltage VSN is applied to the second bitline BLB through the NMOS transistors MN11 and MN12. The voltage level of the second bitline BLB decreases by a voltage difference between the precharge voltage VLB and the pre-sensing voltage VSN. For example, the voltage difference between the precharge voltage VLB and the pre-sensing voltage VSN may be Vthn-a according to Equation 1, above. A pre-sensed voltage difference dVBL' is greater than the input voltage difference dVBL because of the pre-sensing operation.

At time t4, the enable signal ENN is deactivated and the first and second voltage signals LA and LAB are activated. For example, the level of the first voltage signal LA is transitioned from the level of the precharge voltage VBL to a level of an internal voltage VINTA. The internal voltage VINTA may be generated based on the power supply voltage.

The level of the second voltage signal LAB is transitioned from the level of the precharge voltage VBL to a level of a ground voltage VSS. The amplification unit 1300a performs the main amplification operation by amplifying the pre-sensed voltage difference dVBL' based on the first and second voltage signals LA and LAB. An amplified voltage difference dV is greater than the pre-sensed voltage difference dVBL'. The word line enable signal WL is deactivated before the equalization control signal PEQIJB is activated. At time t5, the first and second voltage signals LA and LAB are deactivated.

Referring to FIGS. 3 and 5, at time t1, the equalization control signal PEQIJB is activated. During the time period T1, the first and second bitlines BL and BLB are precharged to the level of the precharge voltage VBL. At time t2, the word line enable signal WL is activated. During the time period T2, charges stored in the memory cell and in the first bitline BL are shared. In FIG. 5, the voltage level of the first bitline BL decreases by an input voltage difference dVBL because the data stored in the memory cell has the second logic level (e.g., logic low level). The voltage level of the first bitline BL is lower than the voltage level of the second bitline BLB and thus the seventh NMOS transistor MN12 is not turned on.

At time t3, the enable signal ENN is activated. During the time period T3, the sixth NMOS transistor MN11 is turned on. However, the pre-sensing voltage VSN is not applied to the second bitline BLB because the seventh NMOS transistor MN12 is turned off. The voltage level of the second bitline BLB maintains the level of the precharge voltage VBL. The difference between the voltage level of the first bitline BL and the voltage level of the second bitline BLB is substantially the same as the input voltage difference dVBL. At time t4, the enable signal ENN is deactivated and the first and second voltage signals LA and LAB are activated. The amplification unit 1300a performs the main amplification operation by amplifying the input voltage difference dVBL based on the first and second voltage signals LA and LAB.

In the bitline sense amplifier 1000a of FIG. 3, according to illustrative embodiments, the pre-sensing unit 1200a performs the pre-sensing operation before the main amplification operation to enhance the sensing margin. Thus, the bitline sense amplifier 1000a of FIG. 3 may effectively sense and amplify the input voltage difference to determine the data stored in the memory cell.

Figure 6:
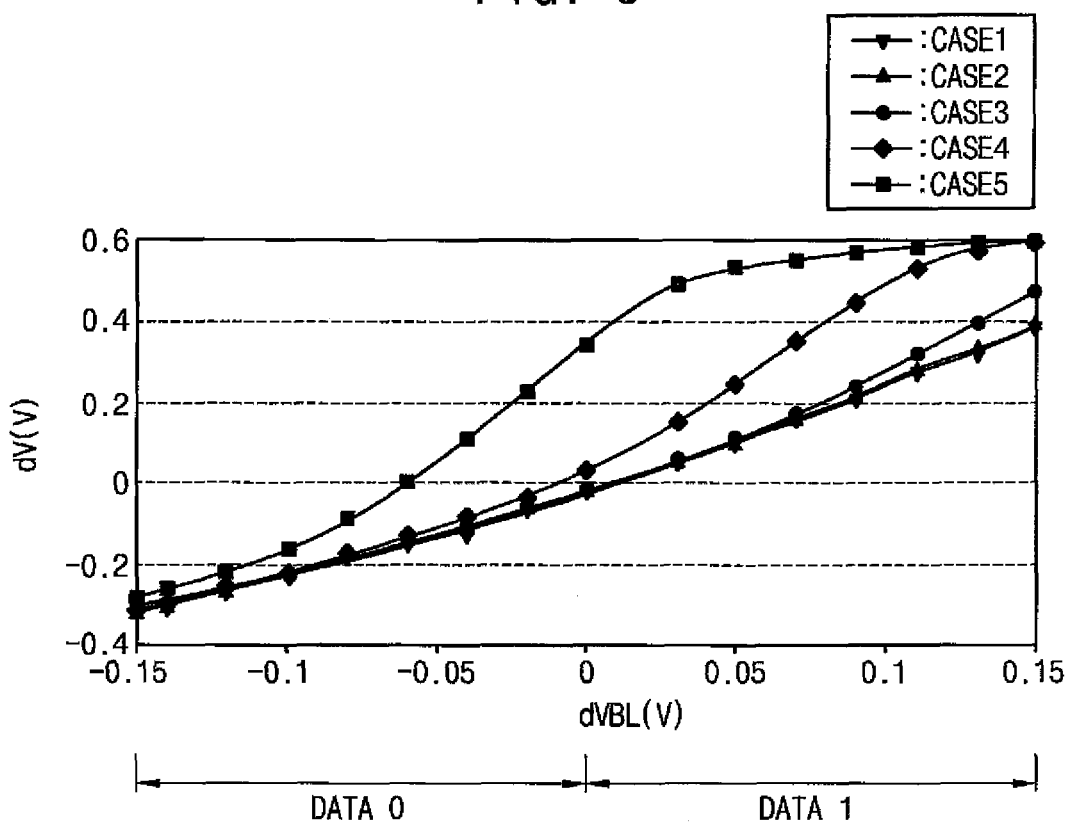
FIG. 6 is a diagram illustrating performances of the bitline sense amplifier of FIG. 3, according to an illustrative embodiment.

FIG. 6 is a diagram illustrating performances of the bitline sense amplifier of FIG. 3, according to illustrative embodiments. FIG. 6 illustrates the performances of the bitline sense amplifier 1000a of FIG. 3, according to the level of the pre-sensing voltage VSN.

In FIG. 6, the X-axis indicates the input voltage difference and the Y-axis indicates a difference between the voltage level of first bitline BL and the voltage level of second bitline BLB in 0.2 ns after the start of the main amplification operation. CASE1 indicates a case in which the conventional bitline sense amplifier does not perform the pre-sensing operation. CASE2 through CASE5 indicate cases in which the bitline sense amplifier 1000a performs the pre-sensing operation during 1 ns with the pre-sensing voltage VSN having different levels. In CASE2, the level of the pre-sensing voltage VSN corresponds to VBL-0.05V. In CASE3, the level of the pre-sensing voltage VSN corresponds to VBL-0.15V. In CASE4, the level of the pre-sensing voltage VSN corresponds to VBL-0.25V. In CASE5, the level of the pre-sensing voltage VSN corresponds to VBL-0.35V.

Referring to FIGS. 3 and 6, the performance of the bitline sense amplifier 1000a in CASE2 is similar to the performance of the conventional bitline sense amplifier in CASE1. In CASE3, the bitline sense amplifier 1000a performs the pre-sensing operation when the data has the first logic level (e.g., logic high level), particularly the input voltage difference dVBL is greater than 0.1V. The pre-sensed voltage difference in CASE3 is greater than the pre-sensed voltage difference in CASE2 when the input voltage difference dVBL is greater than 0.1V.

In CASE4, the bitline sense amplifier 1000a performs the pre-sensing operation when the data has the first logic level. The pre-sensed voltage difference in CASE4 is greater than the pre-sensed voltage difference in CASE2 when the data has the first logic level. The pre-sensed voltage difference in CASE4 is similar to the pre-sensed voltage difference in CASE2 when the data has the second logic level (e.g., logic low level). In CASE5, the bitline sense amplifier 1000a performs the pre-sensing operation when the data has the first logic level and also when the data has the second logic level due to leakage current of NMOS transistors MN11 and MN12. Thus, the pre-sensed voltage difference in CASE5 is smaller than the pre-sensed voltage difference in CASE2 when the data has the second logic level.

As described above, the pre-sensing operation of the pre-sensing unit 1200a is particularly effective when the level of the pre-sensing voltage VSN is greater than VBL-0.25V and lower than VBL-0.15V. When the level of the pre-sensing voltage VSN is lower than VBL-0.25V (e.g., CASE5) or greater than VBL-0.15V (e.g., CASE2), the pre-sensing operation may be ineffective.

Figure 7:
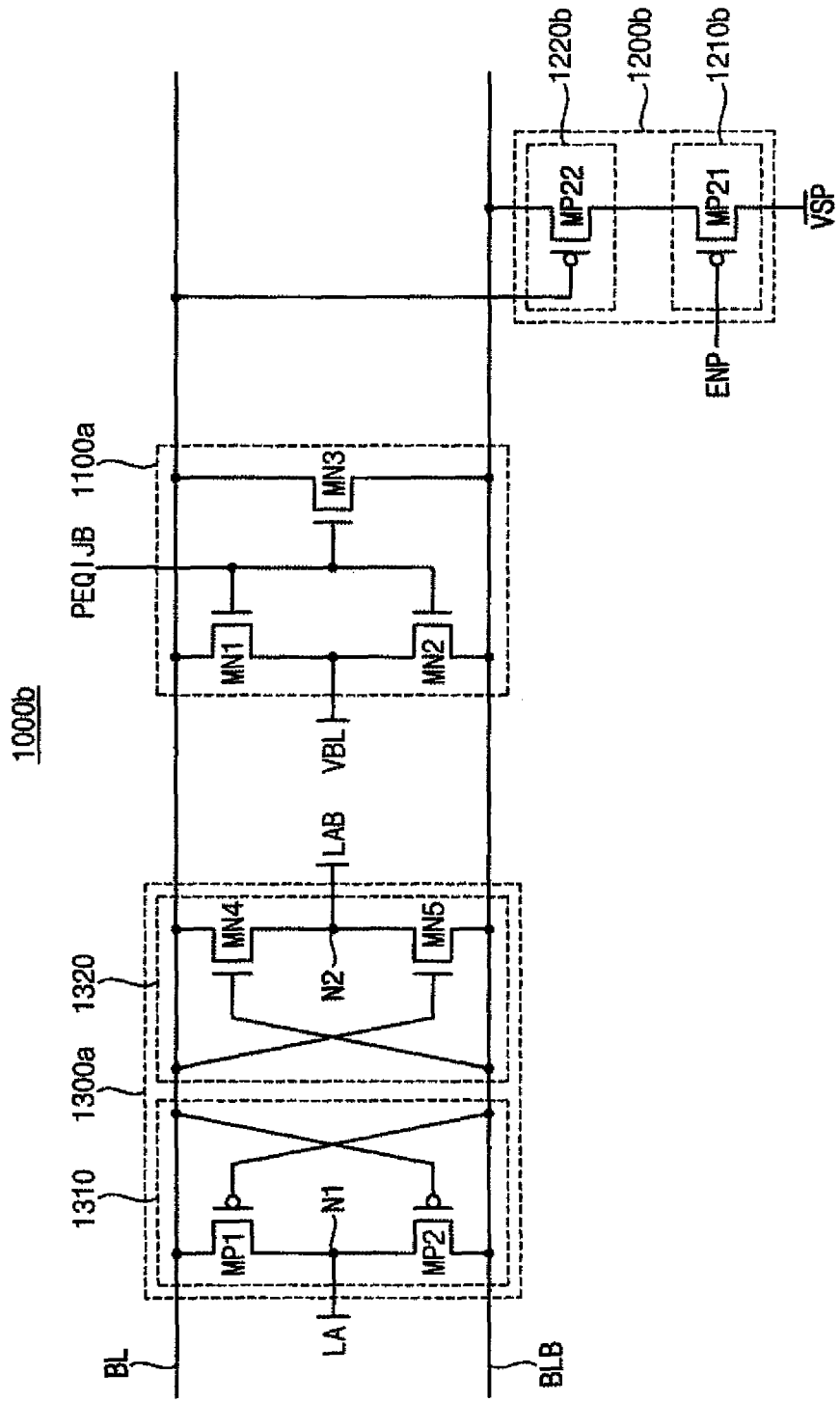
FIG. 7 is a circuit diagram illustrating another example of the bitline sense amplifier of FIG. 1, according to an illustrative embodiment.

FIG. 7 is a circuit diagram illustrating another example of the bitline sense amplifier of FIG. 1, according to an illustrative embodiment. In a bitline sense amplifier 1000b of FIG. 7, the first bitline BL is connected to the memory cell and the second bitline BLB is not connected to the memory cell and operates as a reference bitline.

Referring to FIG. 7, the bitline sense amplifier 1000b includes an equalizer 1100a, a pre-sensing unit 1200b and an amplification unit 1300a.

In comparison with the bitline sense amplifier 1000a of FIG. 3, the bitline sense amplifier 1000b includes the pre-sensing unit 1200b instead of the pre-sensing unit 1200a. The equalizer 1100a and the amplification unit 1300a in FIG. 7 may have substantially the same structure as the equalizer 1100a and the amplification unit 1300a in FIG. 3, respectively, and may operate similarly to the equalizer 1100a and the amplification unit 1300a in FIG. 3, respectively. Thus, in FIG. 7, the same reference numerals will be used to refer the same or like elements in FIG. 3, and further explanation will not be repeated.

The pre-sensing unit 1200b performs the pre-sensing operation by controlling the voltage level of the second bitline BLB based on a pre-sensing voltage VSP and the variation of the voltage level of the first bitline BL due to the charge sharing operation. The pre-sensing unit 1200b includes a pre-sensing voltage providing unit 1210b and a switching unit 1220b.

The pre-sensing voltage providing unit 1210b provides the pre-sensing voltage VSP to the switching unit 1220b based on an enable signal ENP. The pre-sensing voltage providing unit 1210b includes a third PMOS transistor MP21. The third PMOS transistor MP21 has a first electrode connected to the pre-sensing voltage VSP, a gate connected to the enable signal ENP and a second electrode connected to the switching unit 1220b.

The switching unit 1220b selectively applies the pre-sensing voltage VSP to the second bitline BLB based on the varied voltage level of the first bitline BL and the voltage level of the second bitline BLB. The switching unit 1220b includes a fourth PMOS transistor MP22. The fourth PMOS transistor MP22 has a first electrode connected to the second electrode of the third PMOS transistor MP21, a gate connected to the first bitline BL and a second electrode connected to the second bitline BLB.

In an illustrative embodiment, the PMOS transistors MP1, MP2, MP21 and MP22 included in the bitline sense amplifier 1000b may have substantially the same threshold voltage. The pre-sensing voltage VSP may be generated based on the precharge voltage VBL and the threshold voltage and may have a level between the level of the precharge voltage VBL and a level of the internal voltage generated based on the power supply voltage. For example, the pre-sensing voltage VSP may be represented by Equation 2.

$$VSP=VBL+(Vthp-\beta) \quad \text{[Equation 2]}$$

In the Equation 2, Vthp represents the threshold voltage of the PMOS transistors included in the bitline sense amplifier 1000b, and β represents a margin of the threshold voltage Vthp. A level of the threshold voltage Vthp is lower than the input voltage difference in order to turn on the fourth PMOS transistor MP22. For example, the threshold voltage Vthp may have the level of about 0.5V, the margin β may have a voltage level of about 0.25V (e.g., about a half of the level of the threshold voltage Vthp) to about 0.35V, and thus the Vthp-β may have a voltage level of about 0.15V to about 0.25V.

Figure 8:
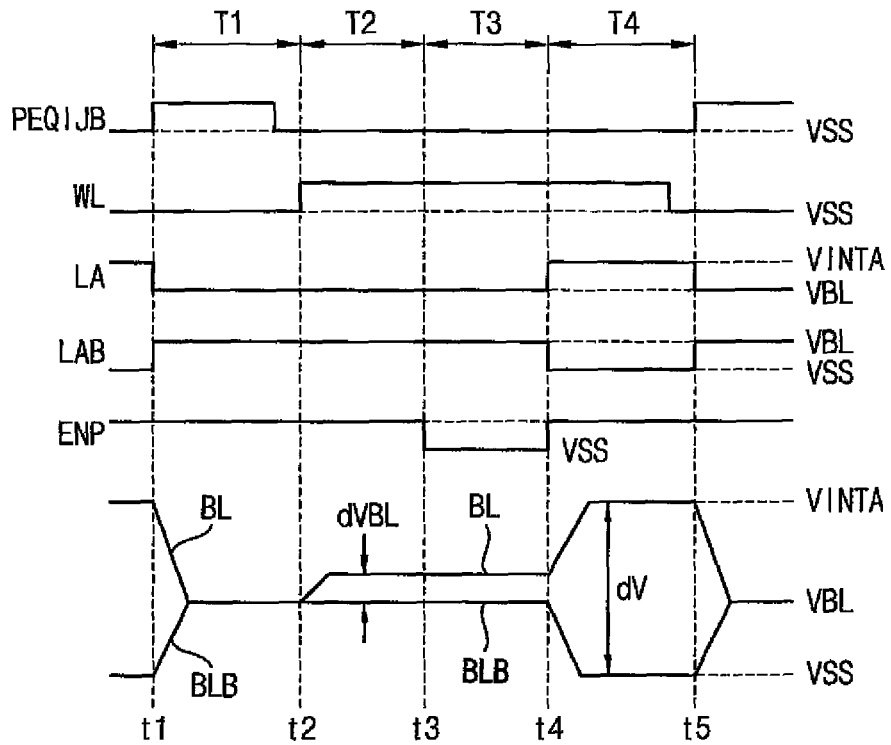
FIGS. 8 and 9 are timing diagrams illustrating operations of the bitline sense amplifier of FIG. 7, according to an illustrative embodiment.
Figure 9:
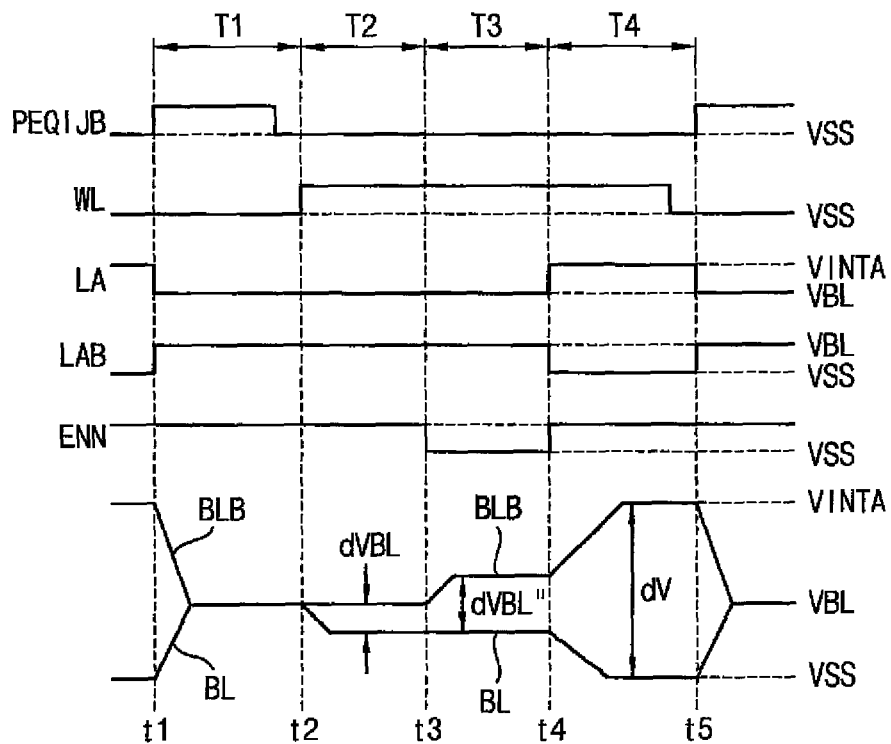

FIGS. 8 and 9 are timing diagrams illustrating operations of the bitline sense amplifier of FIG. 7, according to illustrative embodiments.

FIG. 8 illustrates an operation of the bitline sense amplifier 1000b of FIG. 7 when the data stored in the memory cell connected to the first bitline BL has the first logic level (e.g., "1"). FIG. 9 illustrates an operation of the bitline sense amplifier 1000b of FIG. 7 when the data BL has the second logic level (e.g., "0"). In FIGS. 8 and 9, the same reference numerals will be used to refer the same or like parameters in FIG. 4, discussed above.

Referring to FIGS. 7 and 8, during the time periods T1 and T2, operations of the bitline sense amplifier 1000b may be substantially the same as operations of the bitline sense amplifier 1000a of FIG. 3 as illustrated in FIG. 4, except for the fourth PMOS transistor MP22. The voltage level of the first bitline BL is higher than the voltage level of the second bitline BLB, and thus the fourth PMOS transistor MP22 is not turned on.

At time t3, the enable signal ENP is activated. During the time period T3, the third PMOS transistor MP21 is turned on. However, the pre-sensing voltage VSP is not applied to the second bitline BLB because the fourth PMOS transistor MP22 is turned off. The voltage level of the second bitline BLB maintains the level of the precharge voltage VBL. The difference between the voltage level of the first bitline BL and the voltage level of the second bitline BLB is substantially the same as the input voltage difference dVBL. At time t4, the enable signal ENP is deactivated and the first and second voltage signals LA and LAB are activated. The amplification unit 1300a performs the main amplification operation by amplifying the input voltage difference dVBL based on the first and second voltage signals LA and LAB.

Referring to FIGS. 7 and 9, during the time periods T1 and T2, operations of the bitline sense amplifier 1000b may be substantially the same as operations of the bitline sense amplifier 1000a of FIG. 3 as illustrated in FIG. 5, except for the fourth PMOS transistor MP22. The voltage level of the first bitline BL is lower than the voltage level of the second bitline BLB and thus the fourth PMOS transistor MP22 is turned on due to the variation of the voltage level of the first bitline BL.

At time t3, the enable signal ENP is activated. During the time period T3, the third PMOS transistor MP21 is turned on and the pre-sensing voltage VSP is applied to the second bitline BLB through the PMOS transistors MP21 and MP22. The voltage level of the second bitline BLB increases by a voltage difference between the precharge voltage VLB and the pre-sensing voltage VSP. For example, the voltage difference between the precharge voltage VLB and the pre-sensing voltage VSN may be Vthp-β, according to the Equation 2. A pre-sensed voltage difference dVBL" is greater than the input voltage difference dVBL because of the pre-sensing operation. At time t4, the enable signal ENP is deactivated, and the first and second voltage signals LA and LAB are activated. The amplification unit 1300b performs the main amplification operation by amplifying the pre-sensed voltage difference dVBL" based on the first and second voltage signals LA and LAB.

Figure 10:
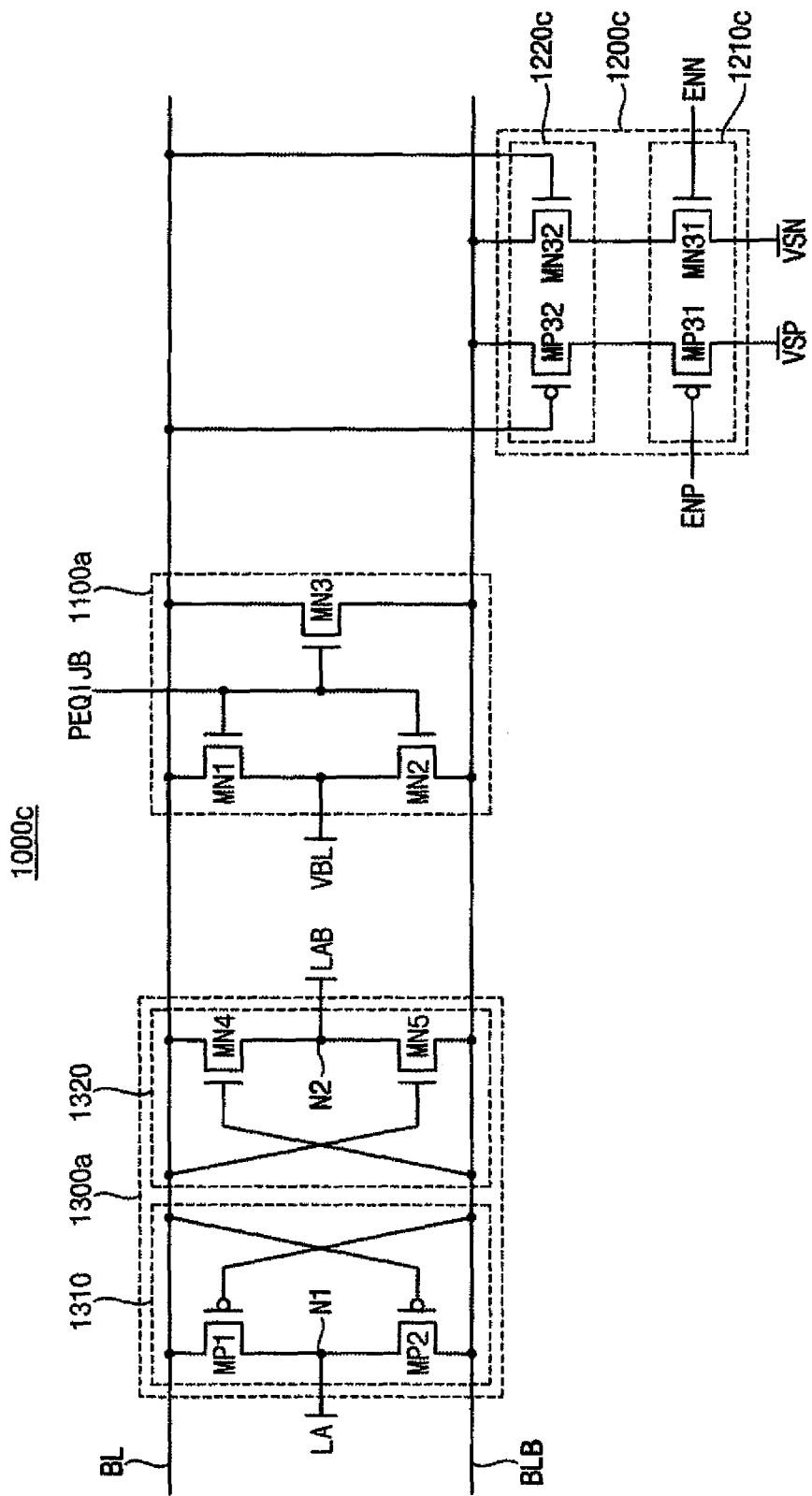
FIGS. 10, 11 and 12 are circuit diagrams illustrating other examples of the bitline sense amplifier of FIG. 1, according to illustrative embodiments.

FIG. 10 is a circuit diagram illustrating still another example of the bitline sense amplifier of FIG. 1, according to an illustrative embodiment. In a bitline sense amplifier 1000c of FIG. 10, the first bitline BL is connected to the memory cell and the second bitline BLB is not connected to the memory cell and operates as a reference bitline.

Referring to FIG. 10, the bitline sense amplifier 1000c includes an equalizer 1100a, a pre-sensing unit 1200c and an amplification unit 1300a.

In comparison with the bitline sense amplifier 1000a of FIG. 3, the bitline sense amplifier 1000c includes the pre-sensing unit 1200c instead of the pre-sensing unit 1200a. The equalizer 1100a and the amplification unit 1300a in FIG. 10 may be substantially the same as the equalizer 1100a and the amplification unit 1300a in FIG. 3, respectively. Thus, in FIG. 10, the same reference numerals will be used to refer the same or like elements in FIG. 3, and further explanation will not be repeated.

The pre-sensing unit 1200c performs the pre-sensing operation by controlling the voltage level of the second bitline BLB based on pre-sensing voltages VSN and VSP and the variation of the voltage level of the first bitline BL due to the charge sharing operation.

In an illustrative embodiment, the pre-sensing unit 1200c applies one of the pre-sensing voltages VSN and VSP to the second bitline BLB based on the varied voltage level of the first bitline BL and the voltage level of the second bitline BLB to control the voltage level of the second bitline BLB. For example, when the varied voltage level of the first bitline BL is higher than the voltage level of the second bitline BLB during the pre-sensing operation, the pre-sensing unit 1200c may apply a first pre-sensing voltage VSN to the second bitline BLB. When the varied voltage level of the first bitline BL is lower than the voltage level of the second bitline BLB during the pre-sensing operation, the pre-sensing unit 1200c may apply a second pre-sensing voltage VSP to the second bitline BLB. Thus, the pre-sensed voltage difference may be greater than the input voltage difference.

The pre-sensing unit 1200c includes a pre-sensing voltage providing unit 1210c and a switching unit 1220c. In an illustrative embodiment, the pre-sensing unit 1200c may have combined structure of the pre-sensing unit 1200a in FIG. 3 and the pre-sensing unit 1200b in FIG. 7.

The pre-sensing voltage providing unit 1210c includes a first pre-sensing voltage providing unit and a second pre-sensing voltage providing unit. The first pre-sensing voltage providing unit provides the first pre-sensing voltage VSN of the at least one pre-sensing voltage based on a first enable signal ENN. The second pre-sensing voltage providing unit provides the second pre-sensing voltage VSP of the at least one pre-sensing voltage based on a second enable signal ENP. For example, the first pre-sensing voltage providing unit may include a sixth NMOS transistor MN31 and the second pre-sensing voltage providing unit may include a third PMOS transistor MP31.

The switching unit 1220c includes a first switching unit and a second switching unit. The first switching unit selectively applies the first pre-sensing voltage VSN to the second bitline BLB based on the varied voltage level of the first bitline BL and the voltage level of the second bitline BLB. The second switching unit selectively applies the second pre-sensing voltage VSP to the second bitline BLB based on the varied voltage level of the first bitline BL and the voltage level of the second bitline BLB. For example, the first switching unit may include a seventh NMOS transistor MN32 and the second switching unit may include a fourth PMOS transistor MP32.

In an illustrative embodiment, when the data stored in the memory cell connected to the first bitline BL has the first logic level (e.g., "1"), the first enable signal ENN is activated, and the first switching unit electrically connects the first pre-sensing voltage providing unit with the second bitline BLB. Also, the first pre-sensing voltage VSN is applied to the second bitline BLB and the voltage level of the second bitline BLB decreases by the voltage difference between the precharge voltage VLB and the first pre-sensing voltage VSN during the pre-sensing operation. Thus, the pre-sensed voltage difference is greater than the input voltage difference because of the pre-sensing operation. In this case, the bitline sense amplifier 1000c operates similarly to the bitline sense amplifier 1000a as illustrated in FIG. 4.

When the data has the second logic level (e.g., "0"), the second enable signal ENP is activated, and the second switching unit electrically connects the second pre-sensing voltage providing unit with the second bitline BLB. Also, the second pre-sensing voltage VSP is applied to the second bitline BLB and the voltage level of the second bitline BLB increases by the voltage difference between the precharge voltage VLB and the second pre-sensing voltage VSP during the pre-sensing operation. Thus, the pre-sensed voltage difference is greater than the input voltage difference because of the pre-sensing operation. In this case, the bitline sense amplifier 1000c operates similarly to the bitline sense amplifier 1000b as illustrated in FIG. 9.

In the bitline sense amplifier 1000c, according to various illustrative embodiments, the pre-sensing unit 1200c may include both of the PMOS transistors and the NMOS transistors and may perform the pre-sensing operation when the data has the first logic level and the second logic level, respectively, to enhance the sensing margin. Thus, the bitline sense amplifier 1000c may effectively sense and amplify the input voltage difference to determine the data stored in the memory cell.

Figure 11:
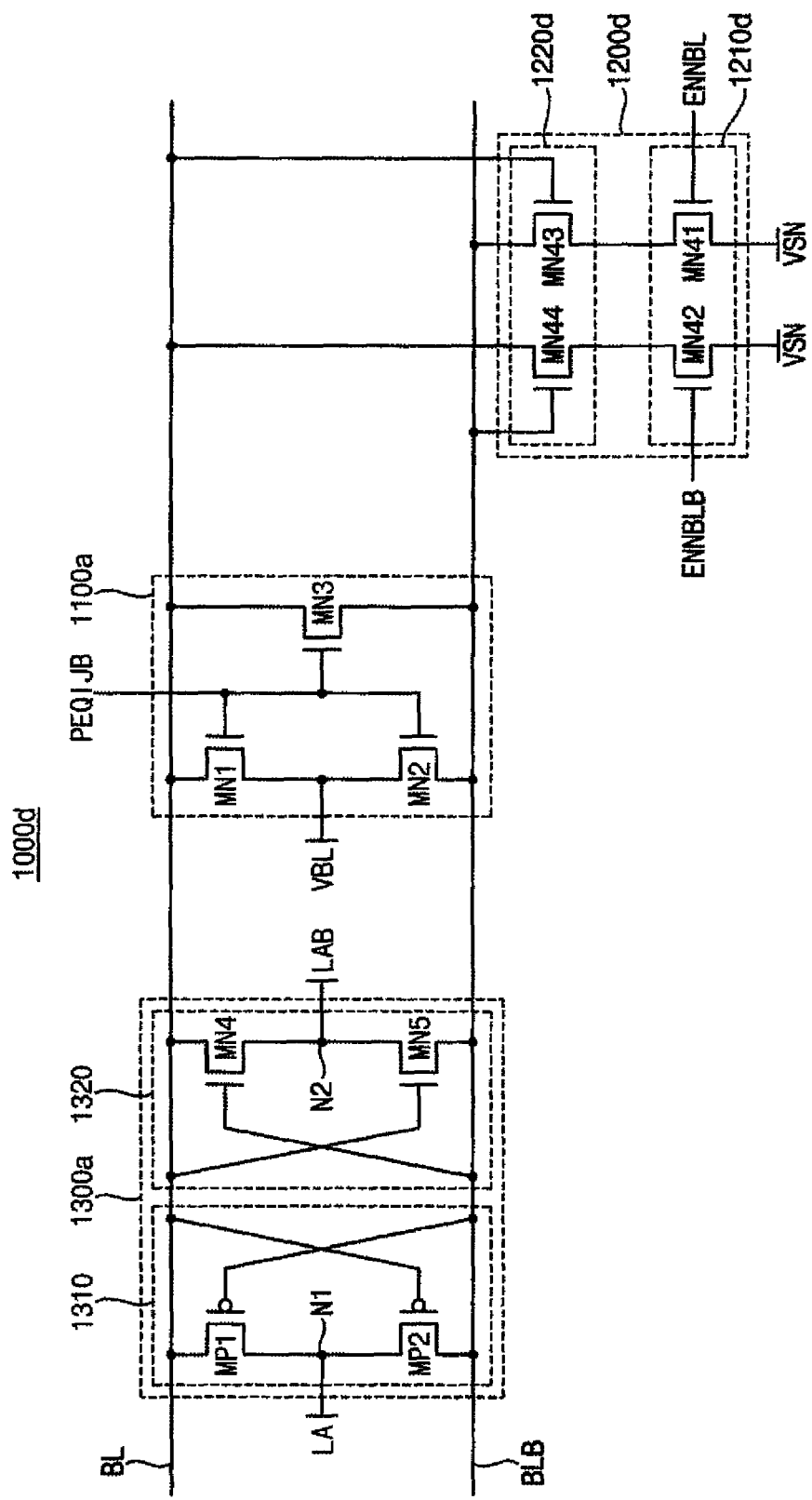

FIG. 11 is a circuit diagram illustrating still another example of the bitline sense amplifier of FIG. 1, according to an illustrative embodiment. In a bitline sense amplifier 1000d of FIG. 11, the first bitline BL is connected to a first memory cell and the second bitline BLB is connected to a second memory cell.

Referring to FIG. 11, the bitline sense amplifier 1000d includes an equalizer 1100a, a pre-sensing unit 1200d and an amplification unit 1300a.

In comparison with the bitline sense amplifier 1000a of FIG. 3, the bitline sense amplifier 1000d includes the pre-sensing unit 1200d instead of the pre-sensing unit 1200a. The equalizer 1100a and the amplification unit 1300a in FIG. 11 may be substantially the same as the equalizer 1100a and the amplification unit 1300a in FIG. 3, respectively. Thus, in FIG. 11, the same reference numerals will be used to refer the same or like elements in FIG. 3, and further explanation will not be repeated.

The pre-sensing unit 1200d performs a first pre-sensing operation by controlling the voltage level of the second bitline BLB based on a pre-sensing voltage VSN and the variation of the voltage level of the first bitline BL due to a first charge sharing operation in which charges stored in the first memory cell and in the first bitline BL are shared. The pre-sensing unit 1200d may further perform a second pre-sensing operation by controlling the voltage level of the first bitline BL based on the pre-sensing voltages VSN and variation of the voltage level of the second bitline BLB due to a second charge sharing operation in which charges stored in the second memory cell and in the second bitline BLB are shared. The pre-sensing unit 1200d includes a pre-sensing voltage providing unit 1210d and a switching unit 1220d.

The pre-sensing voltage providing unit 1210d includes a first pre-sensing voltage providing unit and a second pre-sensing voltage providing unit. The first pre-sensing voltage providing unit provides the pre-sensing voltage VSN based on a first enable signal ENNBL. The second pre-sensing voltage providing unit provides the pre-sensing voltage VSN based on a second enable signal ENNBLB. For example, the first pre-sensing voltage providing unit includes a sixth NMOS transistor MN41 and the second pre-sensing voltage providing unit includes a seventh NMOS transistor MN42.

The switching unit 1220*d* includes a first switching unit and a second switching unit. The first switching unit selectively applies the pre-sensing voltage VSN to the second bitline BLB in response to the varied voltage level of the first bitline BL and the voltage level of the second bitline BLB. The second switching unit selectively applies the pre-sensing voltage VSN to the first bitline BL in response to the voltage level of the first bitline BL and the varied voltage level of the second bitline BLB. For example, the first switching unit includes an eighth NMOS transistor MN43 and the second switching unit may include a ninth NMOS transistor MN44.

The first pre-sensing operation is performed similarly to the pre-sensing operation as illustrated in FIGS. 4 and 5. In this case, the first pre-sensing voltage providing unit and the first switching unit perform the first pre-sensing operation, and the first enable signal ENNBL is substituted for the enable signal ENN in FIGS. 4 and 5.

The second pre-sensing operation is performed similarly to the pre-sensing operation as illustrated in FIGS. 4 and 5. In this case, the second pre-sensing voltage providing unit and the second switching unit perform the second pre-sensing operation, and the second enable signal ENNBLB is substituted for the enable signal ENN in FIGS. 4 and 5. In addition, the voltage level of the second bitline BLB and the voltage level of the first bitline BL may be substituted for the voltage level of the first bitline BL and the voltage level of the second bitline BLB in FIGS. 4 and 5, respectively.

The pre-sensing unit 1200*d* may be implemented with only PMOS transistors or both of PMOS and NMOS transistors according to alternative illustrative embodiments.

Figure 12:
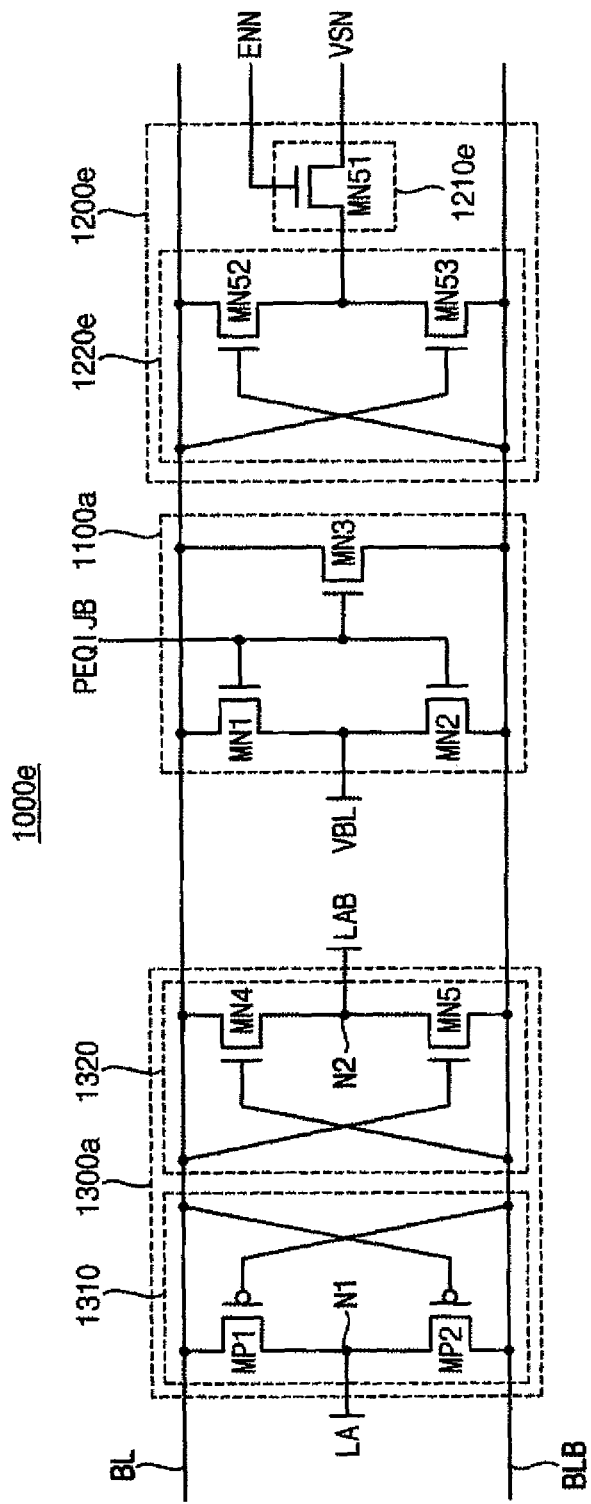

FIG. 12 is a circuit diagram illustrating still another example of the bitline sense amplifier of FIG. 1, according to an illustrative embodiment. In a bitline sense amplifier 1000*e* of FIG. 12, the first bitline BL is connected to a first memory cell and the second bitline BLB is connected to a second memory cell.

Referring to FIG. 12, the bitline sense amplifier 1000*e* includes an equalizer 1100*a*, a pre-sensing unit 1200*e* and an amplification unit 1300*a*.

In comparison with the bitline sense amplifier 1000*a* of FIG. 3, the bitline sense amplifier 1000*e* includes the pre-sensing unit 1200*e* instead of the pre-sensing unit 1200*a*. The equalizer 1100*a* and the amplification unit 1300*a* in FIG. 12 may be substantially the same as the equalizer 1100*a* and the amplification unit 1300*a* in FIG. 3, respectively. Thus, in FIG. 12, the same reference numerals will be used to refer the same or like elements in FIG. 3, and further explanation will not be repeated.

As described above with reference to FIG. 11, the pre-sensing unit 1200*e* performs the first pre-sensing operation and may further perform the second pre-sensing operation. The pre-sensing unit 1200*e* includes a pre-sensing voltage providing unit 1210*e* and a switching unit 1220*e*.

The pre-sensing voltage providing unit 1210*e* includes a sixth NMOS transistor MN51. The sixth NMOS transistor MN51 has a first electrode connected to the pre-sensing voltage VSN, a gate connected to an enable signal ENN and a second electrode connected to the switching unit 1220*e*.

The switching unit 1220*e* includes a seventh NMOS transistor MN52 and an eighth NMOS transistor MN53 that are connected between the first bitline BL and the second bitline BLB in serial. The switching unit 1220*e* has structure that is substantially the same as structure of the n-type amplification unit 1320. One of the sixth and seventh NMOS transistors MN51 and MN52 is turned on based on the voltage levels of the first and second bitlines BL and BLB during the pre-sensing operation, whereas both of the fourth and fifth NMOS transistors MN4 and MN5 are turned on during the main amplification operation.

The bitline sense amplifier 1000*e* performs the first and second pre-sensing operations similar to the pre-sensing operation as illustrated in FIGS. 4 and 5, for example. In comparison with the pre-sensing unit 1200*d* in FIG. 11, the pre-sensing unit 1200*e* applies the pre-sensing voltage VSN to the first bitline BL or the second bitline BLB based on a single enable signal ENN. Thus, the number of transistors included in the pre-sensing unit 1200*e* may be smaller than the number of transistors included in the pre-sensing unit 1200*d* in FIG. 11, and the semiconductor memory device that includes the bitline sense amplifier 1000*e* may have an increased degree of integration.

The pre-sensing unit 1200*e* may be implemented with only PMOS transistors or both of PMOS and NMOS transistors according to alternative illustrative embodiments.

Figure 13:
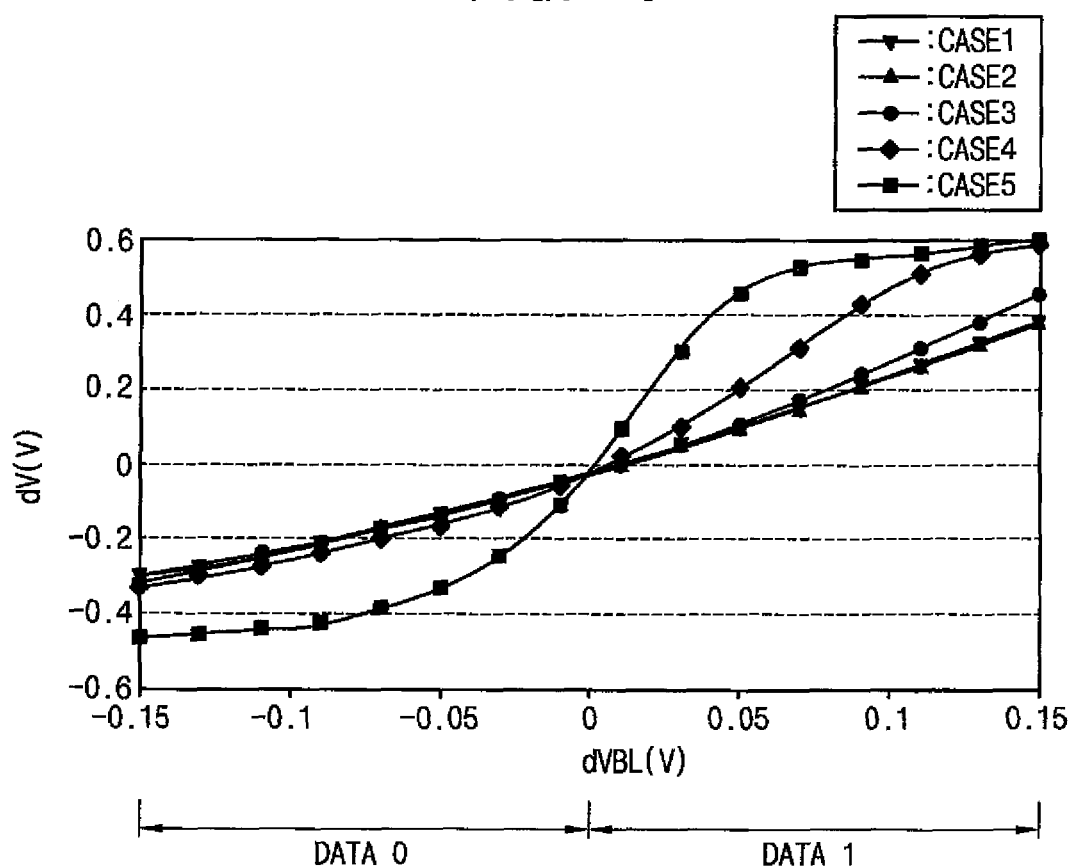
FIG. 13 is a diagram illustrating performances of the bitline sense amplifier of FIG. 12, according to illustrative embodiments.

FIG. 13 is a diagram illustrating performances of the bitline sense amplifier of FIG. 12. FIG. 13 illustrates the performances of the bitline sense amplifier 1000*e* of FIG. 12 according to the level of the pre-sensing voltage VSN. In FIG. 13, the same reference numerals will be used to refer the same or like parameters as in FIG. 6.

Referring to FIGS. 12 and 13, performance of the bitline sense amplifier 1000*e* in CASE2 is similar to performance of the conventional bitline sense amplifier in CASE1. In CASE3, when the data has the first logic level (e.g., logic high level), particularly when the input voltage difference dVBL is greater than 0.1V, the bitline sense amplifier 1000*e* performs the pre-sensing operation and the pre-sensed voltage difference in CASE3 is greater than the pre-sensed voltage difference in CASE2.

In CASE4, when the data has the first logic level, the bitline sense amplifier 1000*e* performs the pre-sensing operation and the pre-sensed voltage difference in CASE4 is greater than the pre-sensed voltage difference in CASE2. When the data has the second logic level (e.g., logic low level), the pre-sensed voltage difference in CASE4 is similar to the pre-sensed voltage difference in CASE2. In CASE5, the bitline sense amplifier 1000*e* performs the pre-sensing operation when the data has the first logic level and also when the data has the second logic level because both of the NMOS transistors MN52 and MN53 are turned on. The pre-sensing operation in CASE5 may be similar to the main amplification operation and thus the pre-sensing operation in CASE5 may be ineffective.

As described above, the pre-sensing operation of the pre-sensing unit 1200*e* is particularly effective when the level of the pre-sensing voltage VSN is greater than VBL-0.25V and lower than VBL-0.15V.

Figure 14:
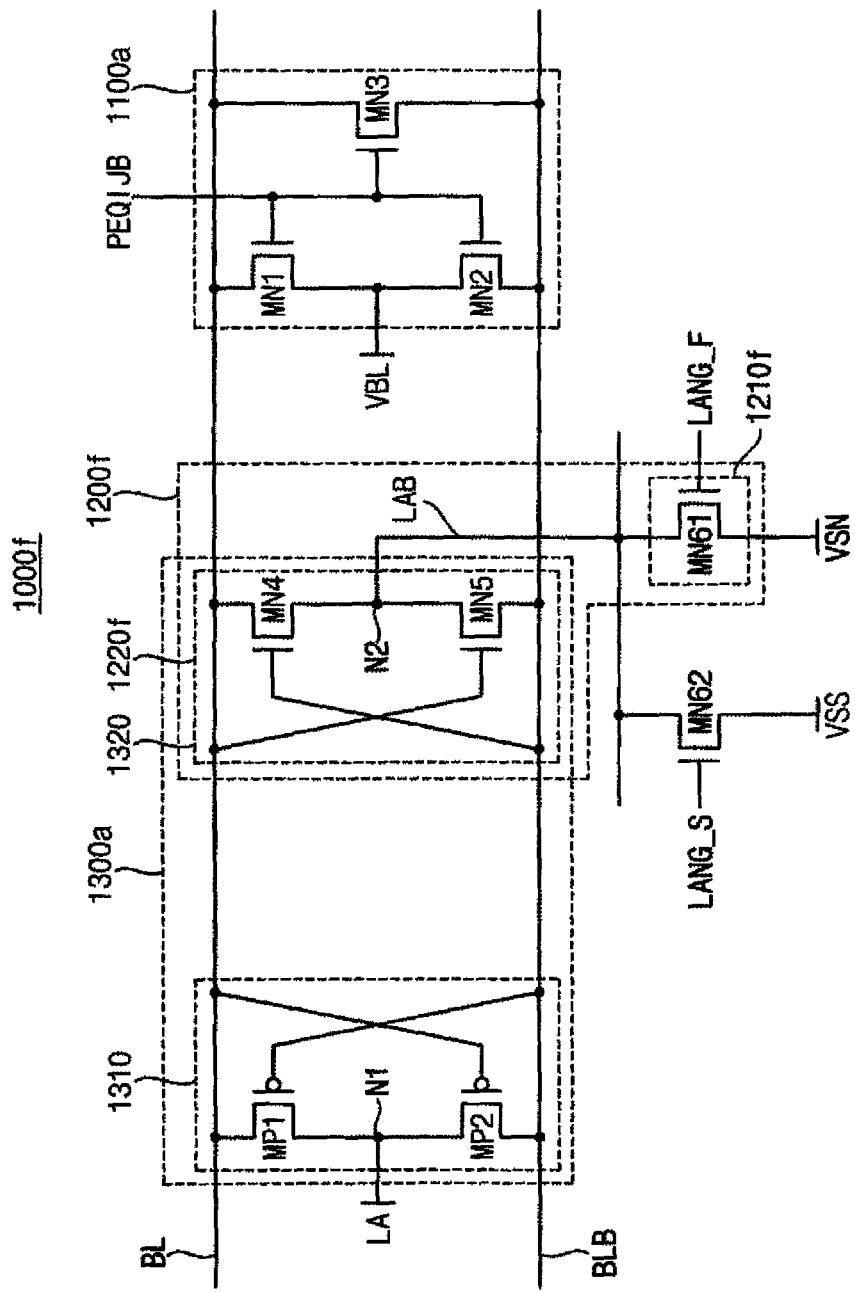
FIGS. 14 and 15 are circuit diagrams illustrating still other examples of the bitline sense amplifier of FIG. 1, according to illustrative embodiments.

FIG. 14 is a circuit diagram illustrating still another example of the bitline sense amplifier of FIG. 1, according to an illustrative embodiment. In a bitline sense amplifier 1000*f* of FIG. 14, the first bitline BL is connected to a first memory cell and the second bitline BLB is connected to a second memory cell.

Referring to FIG. 14, the bitline sense amplifier 1000*f* includes an equalizer 1100*a*, a pre-sensing unit 1200*f* and an amplification unit 1300*a*.

In comparison with the bitline sense amplifier 1000*a* of FIG. 3, the bitline sense amplifier 1000*f* includes the pre-sensing unit 1200*f* instead of the pre-sensing unit 1200*a*. The equalizer 1100*a* and the amplification unit 1300*a* in FIG. 14 may be substantially the same as the equalizer 1100*a* and the amplification unit 1300*a* in FIG. 3, respectively. Thus, in FIG. 14, the same reference numerals will be used to refer the same or like elements in FIG. 3, and further explanation will not be repeated. Notably, though, the n-type amplification unit 1320 of the amplification unit 1300a is also configured to function as a switching unit 1220f for the pre-sensing unit 1200f, as discussed below.

As described above with reference to FIG. 11, the pre-sensing unit 1200f performs the first pre-sensing operation and may further perform the second pre-sensing operation. The pre-sensing unit 1200f includes a pre-sensing voltage providing unit 1210f and the switching unit 1220f.

The pre-sensing voltage providing unit 1210f provides a pre-sensing voltage VSN based on an enable signal LANG_F. The pre-sensing voltage providing unit 1210f includes a sixth NMOS transistor MN61. The sixth NMOS transistor MN61 has a first electrode connected to the pre-sensing voltage VSN, a gate connected to the enable signal LANG_F and a second electrode connected to a second node N2 in the switching unit 1220f. In an illustrative embodiment, the pre-sensing voltage providing unit 1210f is disposed in a conjunction region of a semiconductor memory device, for example.

The switching unit 1220f selectively applies the pre-sensing voltage VSN to the second bitline BLB based on the varied voltage level of the first bitline BL and the voltage level of the second bitline BLB. The switching unit 1220f includes the fourth NMOS transistor MN4 and the fifth NMOS transistor MN5 that are connected between the first bitline BL and the second bitline BLB in serial.

In an illustrative embodiment, the fourth and fifth NMOS transistors MN4 and MN5 operate selectively as the switching unit 1220f of the pre-sensing unit 1200f and as the n-type amplification unit 1320 of the amplification unit 1300a. For example, when the pre-sensing voltage VSN is applied to the second node N2 through the second power supply line LAB during the pre-sensing operation, the fourth and fifth transistors MN4 and MN5 operate as the switching unit 1220f of the pre-sensing unit 1200f. When the second voltage signal LAB has the level of the ground voltage VSS and is applied to the second node N2 through the second power supply line LAB during the main amplification operation, the fourth and fifth NMOS transistors MN4 and MN5 operate as the n-type amplification unit 1320 of the amplification unit 1300a.

The bitline sense amplifier 1000f further includes a seventh NMOS transistor MN62. The seventh NMOS transistor MN62 provides the ground voltage VSS based on a switch control signal LANG_S. The bitline sense amplifier 1000f further includes an amplification control unit (not illustrated) that controls the amplification unit 1300a and the seventh NMOS transistor MN62. The seventh NMOS transistor MN62 may be a transistor included in the amplification control unit.

The bitline sense amplifier 1000f performs the pre-sensing operation similar to the pre-sensing operation illustrated in FIGS. 4 and 5. In this case, the enable signal LANG_F is substituted for the enable signal ENN in FIGS. 4 and 5.

In the bitline sense amplifier 1000f, according to various illustrative embodiments, the NMOS transistors MN4 and MN5 operate selectively as part of the pre-sensing unit 1200f and the amplification unit 1300a based on signals applied to the first node N1 and operation modes of the bitline sense amplifier 1000f. In addition, the pre-sensing voltage providing unit 1210f may be disposed in the conjunction region of the semiconductor memory device. Thus, the number of transistors included in the pre-sensing unit 1200f may be smaller than the number of transistors included in the pre-sensing unit 1200e, for example, increasing the degree of integration of the semiconductor memory device that includes the bitline sense amplifier 1000f.

The pre-sensing unit 1200f may be implemented with only PMOS transistors, according to various illustrative embodiments.

Figure 15:
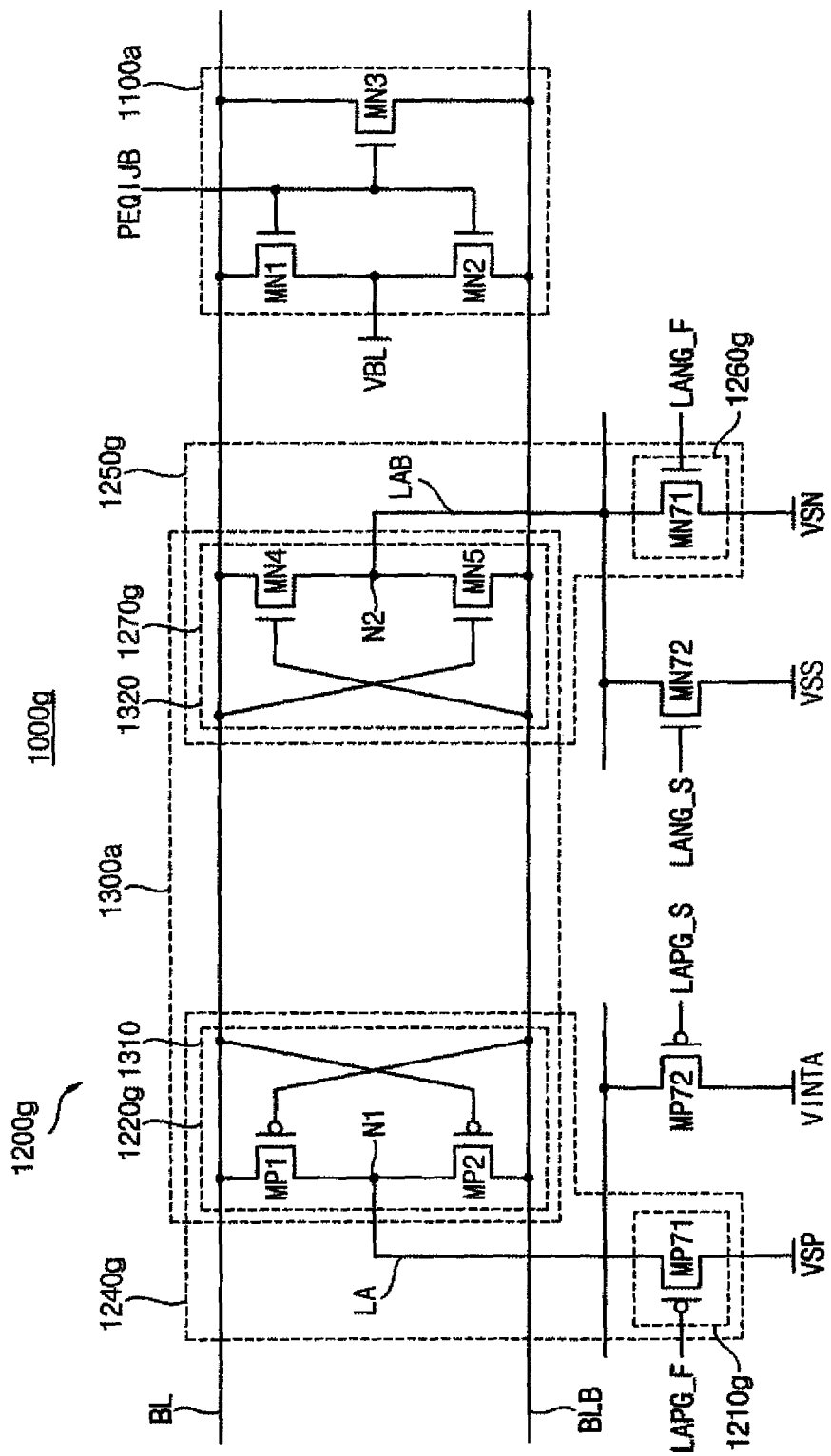

FIG. 15 is a circuit diagram illustrating still another example of the bitline sense amplifier of FIG. 1, according to an illustrative embodiment. In a bitline sense amplifier 1000g of FIG. 15, the first bitline BL is connected to a first memory cell and the second bitline BLB is connected to a second memory cell.

Referring to FIG. 15, the bitline sense amplifier 1000g includes an equalizer 1100a, a pre-sensing unit 1200g and an amplification unit 1300a.

In comparison with the bitline sense amplifier 1000a of FIG. 3, the bitline sense amplifier 1000g includes the pre-sensing unit 1200g instead of the pre-sensing unit 1200a. The equalizer 1100a and the amplification unit 1300a in FIG. 15 may be substantially the same as the equalizer 1100a and the amplification unit 1300a in FIG. 3, respectively. Thus, in FIG. 15, the same reference numerals will be used to refer the same or like elements in FIG. 3, and further explanation will not be repeated. Notably, though, the p-type amplification unit 1310 and the n-type amplification unit 1320 of the amplification unit 1300a are also configured respectively to function as a first switching unit 1220g and a second switching unit 1270g for the pre-sensing unit 1200g, as discussed below.

As described above with reference to FIG. 11, the pre-sensing unit 1200g performs the first pre-sensing operation and may further perform the second pre-sensing operation. The pre-sensing unit 1200g includes a first pre-sensing unit 1240g and a second pre-sensing unit 1250g. The first pre-sensing unit 1240g includes a first pre-sensing voltage providing unit 1210g and the first switching unit 1220g. The second pre-sensing unit 1250g includes a second pre-sensing voltage providing unit 1260g and the second switching unit 1270g.

The first pre-sensing voltage providing unit 1210g provides a first pre-sensing voltage VSP based on a first enable signal LAPG_F, and includes a third PMOS transistor MP71. The first switching unit 1220g selectively applies the first pre-sensing voltage VSP to the second bitline BLB based on the varied voltage level of the first bitline BL and the voltage level of the second bitline BLB, and includes the first PMOS transistor MP1 and the second PMOS transistor MP2.

In an illustrative embodiment, the first and second PMOS transistors MP1 and MP2 operate selectively as part of the first pre-sensing unit 1240g and the amplification unit 1300a. For example, when the first pre-sensing voltage VSP is applied to a first node N1 through the first power supply line LA during the pre-sensing operation, the first and second PMOS transistors MP1 and MP2 operate as the first switching unit 1220g of the first pre-sensing unit 1240g. When the first voltage signal LA has the level of the internal voltage VINTA and is applied to the first node N1 through the first power supply line LA during the main amplification operation, the first and second PMOS transistors MP1 and MP2 operate as the p-type amplification unit 1310 of the amplification unit 1300a.

The second pre-sensing voltage providing unit 1260g provides a second pre-sensing voltage VSN based on a second enable signal LANG_F, and includes a sixth NMOS transistor MN71. The second switching unit 1270g selectively applies the second pre-sensing voltage VSN to the second bitline BLB based on the varied voltage level of the first bitline BL and the voltage level of the second bitline BLB, and includes the fourth NMOS transistor MN4 and the fifth NMOS transistor MN5. In an illustrative embodiment, the fourth and fifth NMOS transistors MN4 and MN5 operate selectively as the second switching unit 1270g of the second pre-sensing unit 1250g and as the n-type amplification unit 1320 of the amplification unit 1300a, e.g., as discussed above with reference to the switching unit 1220f in FIG. 14.

The bitline sense amplifier 1000g further includes a fourth PMOS transistor MP72 and a seventh NMOS transistor MN72. The fourth PMOS transistor MP72 provides the internal voltage VINTA based on a first switch control signal LAPG_S. The seventh NMOS transistor MN72 provides the ground voltage VSS based on a second switch control signal LANG_S.

The bitline sense amplifier 1000g performs the pre-sensing operation similar to the pre-sensing operation illustrated in FIGS. 4 and 9. In this case, the first enable signal LAPG_F is substituted for the enable signal ENP in FIG. 9, and the second enable signal LANG_F is substituted for the enable signal ENN in FIG. 4.

Figure 16:
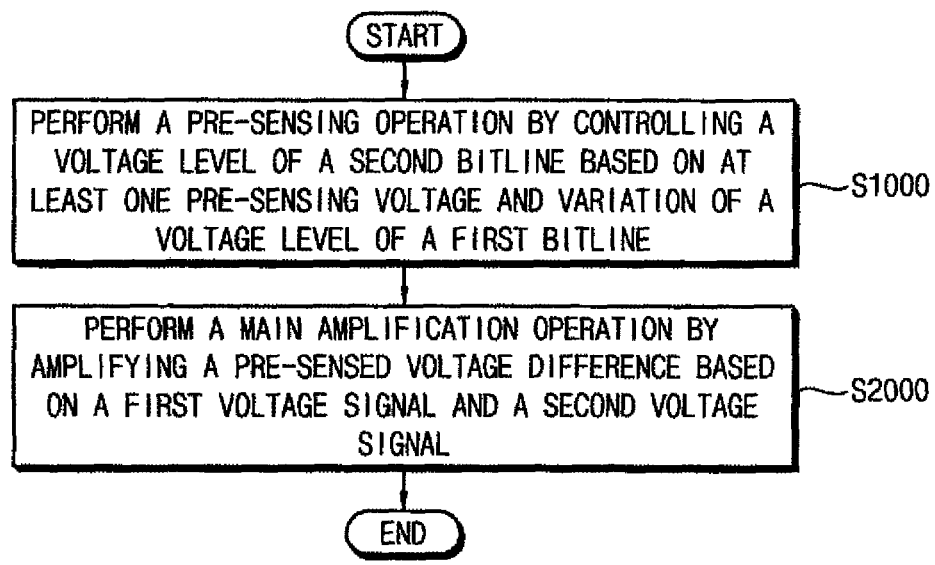
FIG. 16 is a flow chart illustrating a method of sensing charge from a memory cell in a semiconductor memory device, according to illustrative embodiments.

FIG. 16 is a flow chart illustrating a method of sensing charge from a memory cell in a semiconductor memory device, according to illustrative embodiments.

Referring to FIG. 16, a pre-sensing operation is performed by controlling a voltage level of the second bitline based on at least one pre-sensing voltage and variation of a voltage level of the first bitline (step S1000). A main amplification operation is performed by amplifying a pre-sensed voltage difference based on a first voltage signal and a second voltage signal (step S2000). The pre-sensed voltage difference indicates a difference between the voltage level of the first bitline and the voltage level of the second bitline after the pre-sensing operation.

In illustrative embodiments, the semiconductor memory device includes multiple transistors that perform selectively one of the pre-sensing operation an the main amplification operation.

Figure 17:
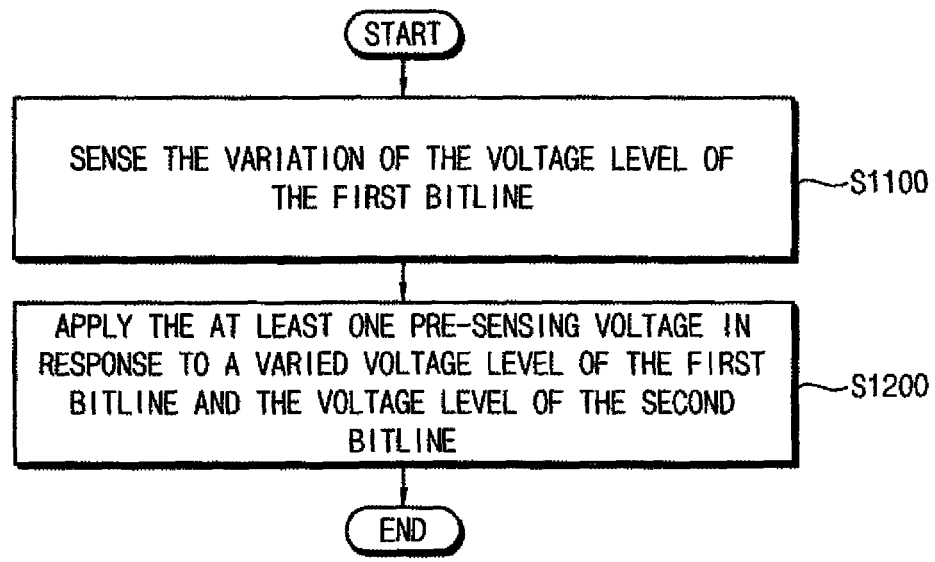
FIG. 17 is a flow chart illustrating an example of performing the pre-sensing operation of FIG. 16, according to an illustrative embodiment.

FIG. 17 is a flow chart illustrating an example of performing the pre-sensing operation of FIG. 16, according to illustrative embodiments.

Referring to FIG. 17, the variation of the voltage level of the first bitline is sensed (step S1100). The at least one pre-sensing voltage is applied to the second bitline in response to a varied voltage level of the first bitline and the voltage level of the second bitline (step S1200). In illustrative embodiments, before step S1200, the at least one pre-sensing voltage may be provided based on at least one enable signal. For example, the at least one pre-sensing voltage may be provided when the at least one enable signal is activated.

In an illustrative embodiment, when the varied voltage level of the first bitline is higher than the voltage level of the second bitline during the pre-sensing operation, the at least one pre-sensing voltage may be applied to the second bitline. When the varied voltage level of the first bitline is lower than the voltage level of the second bitline during the pre-sensing operation, the voltage level of the second bitline may be maintained.

In another illustrative embodiment, when the varied voltage level of the first bitline is higher than the voltage level of the second bitline during the pre-sensing operation, a first pre-sensing voltage of the at least one pre-sensing voltage may be applied to the second bitline. When the varied voltage level of the first bitline is lower than the voltage level of the second bitline during the pre-sensing operation, a second pre-sensing voltage of the at least one pre-sensing voltage may be applied to the second bitline.

The voltage level of the first bitline is varied before the pre-sensing operation is performed based on a logic level of data stored in the memory cell. For example, when the data has a first logic level, the voltage level of the first bitline may increase. When the data has a second logic level, the voltage level of the first bitline may decrease. The first logic level may be a logic high level (e.g., "1") and the second logic level may be a logic low level (e.g., "0"), for example.

Figure 18:
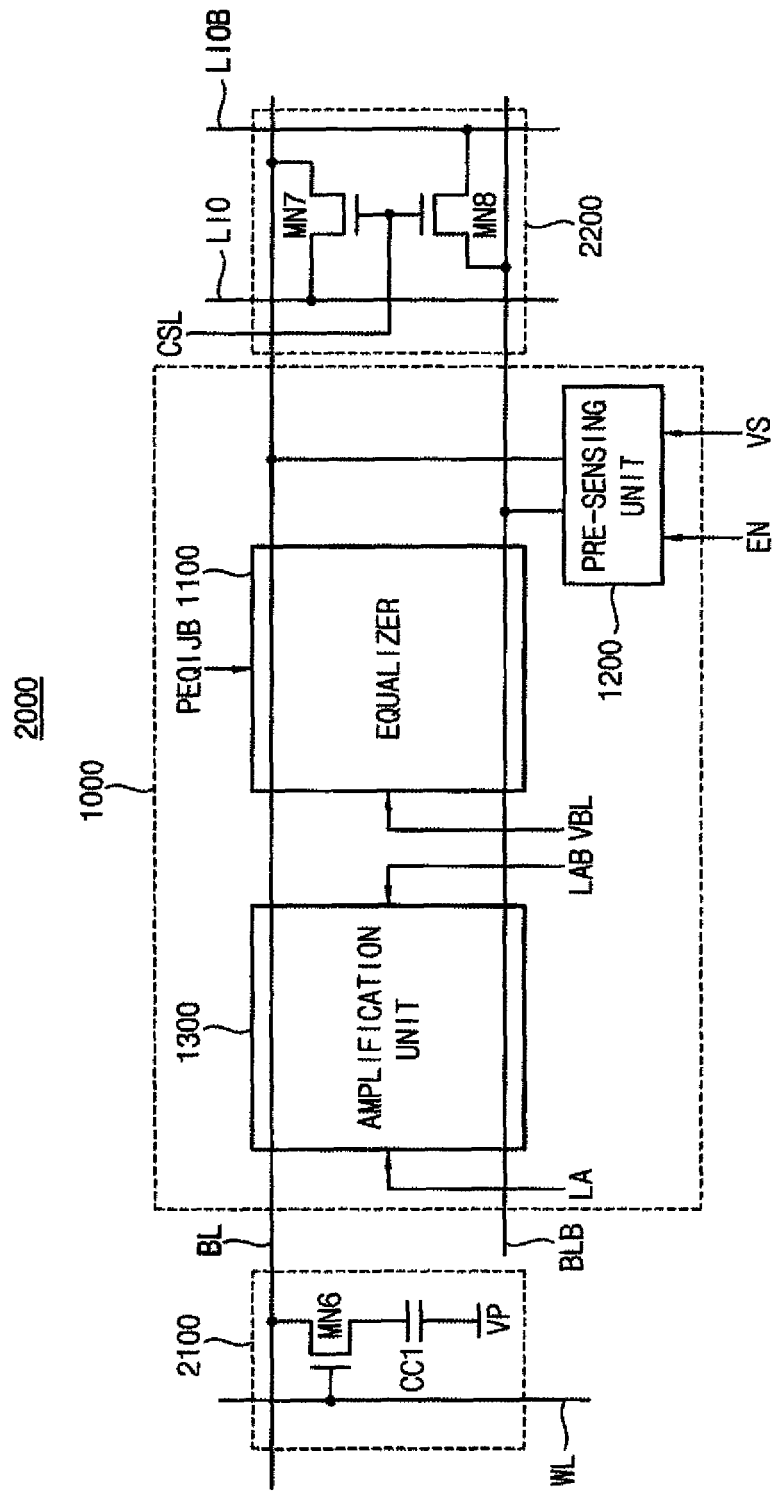
FIG. 18 is a block diagram illustrating an example of a memory core, according to illustrative embodiments.

FIG. 18 is a block diagram illustrating an example of a memory core, according to illustrative embodiments.

Referring to FIG. 18, a memory core 2000 includes a memory cell 2100, a bitline sense amplifier 1000 and a column selection circuit 2200.

The memory cell 2100 is connected to a first bitline BL and a wordline WL. The memory cell 2100 may include a NMOS transistor MN6 and a cell capacitor CC1 that are connected between the first bitline BL1 and a cell plate voltage VP in serial. A wordline enable signal is applied to a gate of the NMOS transistor MN6 through the wordline WL.

The bitline sense amplifier 1000 performs a pre-sensing operation by controlling a voltage level of the second bitline BLB based on at least one pre-sensing voltage VS and variation of a voltage level of the first bitline BL due to a charge sharing operation. The bitline sense amplifier 1000 performs a main amplification operation by amplifying a pre-sensed voltage difference based on a first voltage signal LA and a second voltage signal LAB. The pre-sensed voltage difference indicates a difference between the voltage level of the first bitline BL and the voltage level of the second bitline BLB after the pre-sensing operation.

The bitline sense amplifier 1000 may include an equalizer 1100, a pre-sensing unit 1200 and an amplification unit 1300, and may be substantially the same as the bitline sense amplifier 1000 of FIG. 1. When the memory cell 2100 is connected to the first bitline BL, the bitline sense amplifier 1000 may be one of the bitline sense amplifier 1000a of FIG. 3, the bitline sense amplifier 1000b of FIG. 7 and the bitline sense amplifier 1000c of FIG. 10, for example, according to illustrative embodiments.

The column selection circuit 2200 electrically connects the first bitline BL with a first local input/output (I/O) line LIO and electrically connects the second bitline BLB with a second local I/O line LIOB based on a column selection signal CSL. The column selection circuit 2200 may include NMOS transistors MN7 and MN8. The NMOS transistor MN7 is connected between the first bitline BL and the first local I/O line LIO. The NMOS transistor MN8 is connected between the second bitline BLB and the second local I/O line LIOB. Gates of the NMOS transistor MN7 and MN8 are connected to the column selection signal CSL.

The memory cell 2100 may be connected to the second bitline BLB, according to illustrative embodiments. In this case, the bitline sense amplifier 1000 may perform the pre-sensing operation by controlling the voltage level of the first bitline BL based on the at least one pre-sensing voltage VS and variation of the voltage level of the second bitline BLB due to the charge sharing operation.

Although one memory cell and one bitline sense amplifier are illustrated in FIG. 18 for convenience of illustration, the memory core 2000 may include multiple memory cells and multiple bitline sense amplifiers, without departing from the scope of the present teachings.

Figure 19:
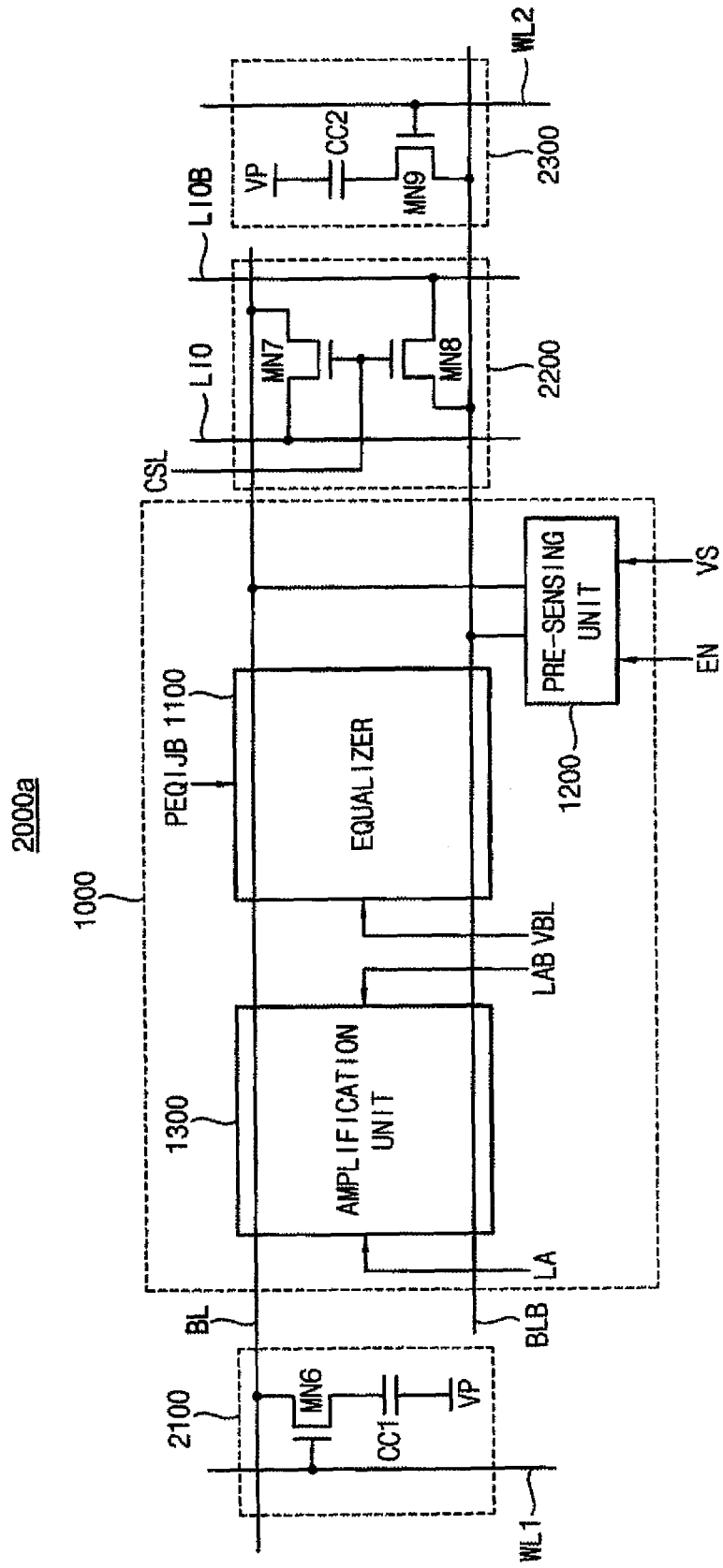
FIG. 19 is a block diagram illustrating another example of a memory core, according to illustrative embodiments.

FIG. 19 is a block diagram illustrating another example of a memory core, according to illustrative embodiments.

Referring to FIG. 19, a memory core 2000a includes a first memory cell 2100, a bitline sense amplifier 1000, a column selection circuit 2200 and a second memory cell 2300.

In comparison with the memory core 2000 of FIG. 18, the memory core 2000a further includes the second memory cell 2300. The first memory cell 2100 and the column selection circuit 2200 in FIG. 19 may be substantially the same as the memory cell 2100 and the column selection circuit 2200 in FIG. 18, respectively, where the first memory cell 2100 is connected to a first bitline BL and a first wordline WL1. Thus, in FIG. 19, the same reference numerals will be used to refer the same or like elements in FIG. 18, and further explanation will not be repeated.

The second memory cell 2300 is connected to a second bitline BLB and a second wordline WL2. The second memory cell 2300 may include a NMOS transistor MN9 and a cell capacitor CC2 that are connected between the second bitline BLB and a cell plate voltage VP in serial. A wordline enable signal is applied to a gate of the NMOS transistor MN9 through the second wordline WL2.

The bitline sense amplifier 1000 performs a first pre-sensing operation by controlling a voltage level of the second bitline BLB based on at least one pre-sensing voltage VS and variation of a voltage level of the first bitline BL due to a first charge sharing operation in which charges stored in the first memory cell 2100 and in the first bitline BL are shared. The bitline sense amplifier 1000 may further perform a second pre-sensing operation by controlling the voltage level of the first bitline BL based on the at least one pre-sensing voltage VS and variation of the voltage level of the second bitline BLB due to a second charge sharing operation in which charges stored in the second memory 2300 cell and in the second bitline BLB are shared. The bitline sense amplifier 1000 performs a main amplification operation by amplifying a pre-sensed voltage difference based on a first voltage signal LA and a second voltage signal LAB.

When the first memory cell 2100 is connected to the first bitline BL and the second memory cell 2300 is connected to the second bitline BLB, the bitline sense amplifier 1000 may be one of the bitline sense amplifier 1000d of FIG. 11, the bitline sense amplifier 1000e of FIG. 12, the bitline sense amplifier 1000f of FIG. 14 and the bitline sense amplifier 1000g of FIG. 15, for example, according to illustrative embodiments.

Figure 20:
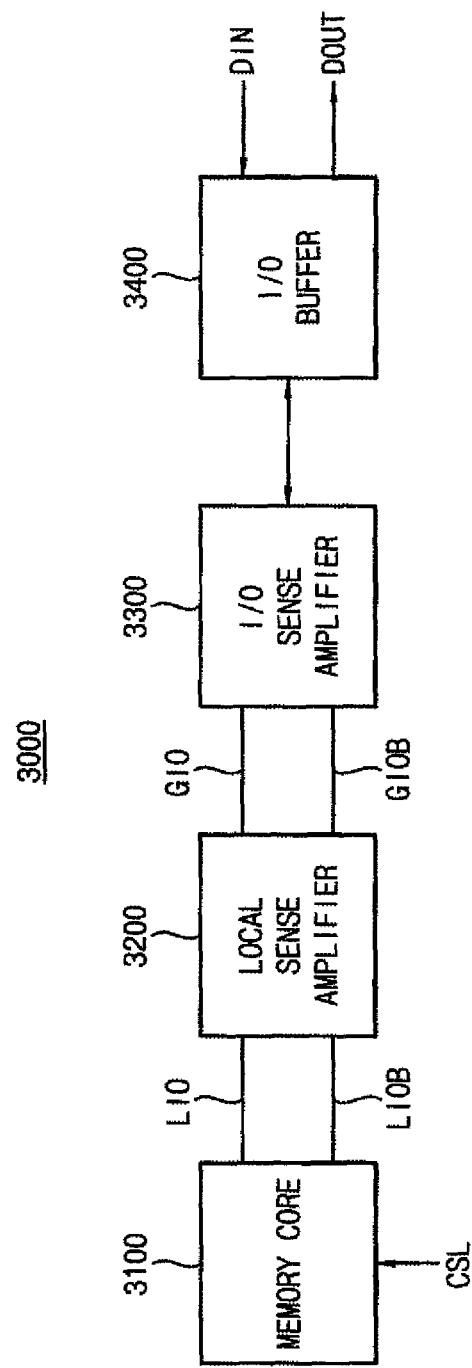
FIG. 20 is a block diagram illustrating a semiconductor memory device, according to illustrative embodiments.

FIG. 20 is a block diagram illustrating a semiconductor memory device, according to illustrative embodiments.

Referring to FIG. 20 the semiconductor memory device 3000 includes a memory core 3100, a local sense amplifier 3200, an I/O sense amplifier 3300 and an I/O buffer 3400.

The memory core 3100 may be one of the memory core 2000 of FIG. 18 and the memory core 2000a of FIG. 19, for example. The memory core 3100 performs a pre-sensing operation based on at least one pre-sensing voltage and variation of a voltage level of a first bitline, performs a main amplification operation by amplifying a pre-sensed voltage difference and provides a difference between the voltage level of the first bitline and a voltage level of a second bitline to the local sense amplifier 3200 through local I/O lines LIO and LIOB. The memory core 3100 may further perform a second pre-sensing operation.

The local sense amplifier 3200 amplifies output signals of the memory core 3100. The I/O sense amplifier 3300 amplifies output signals of the local sense amplifier 3200 provided through global I/O lines GIL and GIOB. The I/O buffer 3400 buffers output signals of the I/O sense amplifier 3300 to provide output data DOUT and buffers input data DIN. The output data DOUT may be output through I/O pads (not illustrated).

As described above, the bitline sense amplifier, according to various illustrative embodiments, may be used in semiconductor memory devices having high degrees of integration.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A bitline sense amplifier comprising:
a pre-sensing unit connected to a first bitline and a second bitline and configured to perform a pre-sensing operation that controls a voltage level of the second bitline by sensing a varied voltage level of the first bitline and applying at least one pre-sensing voltage to the second bitline in response to the varied voltage level of the first bitline; and
an amplification unit configured to perform a main amplification operation by amplifying a pre-sensed voltage difference based on a first voltage signal and a second voltage signal, the pre-sensed voltage difference indicating a difference between the voltage level of the first bitline and the voltage level of the second bitline after the pre-sensing operation.

2. The bitline sense amplifier of claim 1, wherein the pre-sensing unit applies the at least one pre-sensing voltage to the second bitline when the varied voltage level of the first bitline is higher than the voltage level of the second bitline, and
the pre-sensing unit maintains the voltage level of the second bitline when the varied-voltage level of the first bitline is lower than the voltage level of the second bitline.

3. The bitline sense amplifier of claim 1, wherein the pre-sensing unit applies a first pre-sensing voltage of the at least one pre-sensing voltage to the second bitline when the varied voltage level of the first bitline is higher than the voltage level of the second bitline, and
the pre-sensing unit applies a second pre-sensing voltage of the at least one pre-sensing voltage to the second bitline when the varied voltage level of the first bitline is lower than the voltage level of the second bitline.

4. The bitline sense amplifier of claim 1, wherein the pre-sensing unit comprises:
a pre-sensing voltage providing unit configured to provide the at least one pre-sensing voltage in response to at least one enable signal; and
a switching unit configured to apply the at least one pre-sensing voltage to the second bitline in response to a varied voltage level of the first bitline and the voltage level of the second bitline.

5. The bitline sense amplifier of claim 4, wherein the switching unit electrically connects the pre-sensing voltage providing unit with the second bitline when data stored in a memory cell has a first logic level, the memory cell being connected to the first bitline, and
the switching unit electrically disconnects the pre-sensing voltage providing unit from the second bitline when the data has a second logic level.

6. The bitline sense amplifier of claim 4, wherein the amplification unit comprises a plurality of transistors configured to operate selectively as the amplification unit and the switching unit.

7. The bitline sense amplifier of claim 6, wherein the plurality of transistors operates as the switching unit when the at least one pre-sensing voltage is applied to the plurality of transistors, and
the plurality of transistors operates as the amplification unit when one of the first voltage signal and second voltage signal is applied to the plurality of transistors.

8. The bitline sense amplifier of claim 1, wherein the pre-sensing unit comprises:
- a first pre-sensing voltage providing unit configured to provide a first pre-sensing voltage of the at least one pre-sensing voltage in response to a first enable signal;
- a second pre-sensing voltage providing unit configured to provide a second pre-sensing voltage of the at least one pre-sensing voltage in response to a second enable signal;
- a first switching unit configured to apply the first pre-sensing voltage to the second bitline in response to a varied voltage level of the first bitline and the voltage level of the second bitline; and
- a second switching unit configured to apply the second pre-sensing voltage to the second bitline in response to the varied voltage level of the first bitline and the voltage level of the second bitline.

9. The bitline sense amplifier of claim 8, wherein the first switching unit electrically connects the first pre-sensing voltage providing unit with the second bitline when data stored in a memory cell has a first logic level, the memory cell being connected to the first bitline, and
the second switching unit electrically connects the second pre-sensing voltage providing unit with the second bitline when the data has a second logic level.

10. The bitline sense amplifier of claim 1, wherein the pre-sensing unit further performs a second pre-sensing operation by controlling the voltage level of the first bitline based on the at least one pre-sensing voltage and variation of the voltage level of the second bitline.

11. The bitline sense amplifier of claim 10, wherein the pre-sensing unit comprises:
- a first pre-sensing voltage providing unit configured to provide the at least one pre-sensing voltage in response to a first enable signal;
- a second pre-sensing voltage providing unit configured to provide the at least one pre-sensing voltage in response to a second enable signal;
- a first switching unit configured to apply the at least one pre-sensing voltage to the second bitline in response to a varied voltage level of the first bitline and the voltage level of the second bitline; and
- a second switching unit configured to apply the at least one pre-sensing voltage to the first bitline in response to the voltage level of the first bitline and a varied voltage level of the second bitline.

12. The bitline sense amplifier of claim 1, wherein the at least one pre-sensing voltage is generated based on a pre-charge voltage and threshold voltages of transistors included in the bitline sense amplifier.

13. A memory core comprising:
- a plurality of memory cells connected to one of a first bitline and a second bitline;
- a bitline sense amplifier configured to perform a pre-sensing operation that controls a voltage level of the second bitline by sensing a varied voltage level of the first bitline and applying at least one pre-sensing voltage to the second bitline in response to the varied voltage level of the first bitline, and configured to perform a main amplification operation by amplifying a pre-sensed voltage difference based on a first voltage signal and a second voltage signal, the pre-sensed voltage difference indicating a difference between the voltage level of the first bitline and a voltage level of the second bitline after the pre-sensing operation; and
- a column selection circuit configured to electrically connect the first bitline with a first local input/output (I/O) line and configured to electrically connect the second bitline with a second local I/O line based on a column selection signal.

14. The memory core of claim 13, wherein the bitline sense amplifier comprises:
- a pre-sensing unit configured to perform the pre-sensing operation by controlling the voltage level of the second bitline based on the at least one pre-sensing voltage and the varied voltage level of the first bitline; and
- an amplification unit configured to perform the main amplification operation by amplifying the pre-sensed voltage difference based on the first voltage signal and the second voltage signal.

15. A method of sensing charge from a memory cell connected to one of first and second bitlines in a semiconductor memory device, the method comprising:
- performing a pre-sensing operation that controls a voltage level of the second bitline by sensing a varied voltage level of the first bitline and applying at least one pre-sensing voltage to the second bitline in response to the varied voltage level of the first bitline; and
- performing a main amplification operation by amplifying a pre-sensed voltage difference based on a first voltage signal and a second voltage signal, the pre-sensed voltage difference indicating a difference between the voltage level of the first bitline and the voltage level of the second bitline after the pre-sensing operation.

16. The method of claim 15, wherein performing the pre-sensing operation comprises:
- sensing the varied voltage level of the first bitline; and
- applying the at least one pre-sensing voltage to the second bitline in response to the varied voltage level of the first bitline and the voltage level of the second bitline.

17. The method of claim 16, wherein applying the at least one pre-sensing voltage to the second bitline comprises:
- applying the at least one pre-sensing voltage to the second bitline when the varied voltage level of the first bitline is higher than the voltage level of the second bitline, and
- maintaining the voltage level of the second bitline when the varied voltage level of the first bitline is lower than the voltage level of the second bitline.

18. The method of claim 16, wherein applying the at least one pre-sensing voltage to the second bitline comprises:
- applying a first pre-sensing voltage of the at least one pre-sensing voltage to the second bitline when the varied voltage level of the first bitline is higher than the voltage level of the second bitline, and
- applying a second pre-sensing voltage of the at least one pre-sensing voltage to the second bitline when the varied voltage level of the first bitline is lower than the voltage level of the second bitline.

19. The method of claim 16, further comprising:
providing the at least one pre-sensing voltage based on at least one enable signal.

* * * * *